United States Patent
Cha et al.

(10) Patent No.: US 11,068,340 B2
(45) Date of Patent: Jul. 20, 2021

(54) SEMICONDUCTOR MEMORY DEVICES AND MEMORY SYSTEMS

(71) Applicant: Samsung Electronics Co., Ltd., Suwon-si (KR)

(72) Inventors: Sanguhn Cha, Suwon-si (KR); Hoyoung Song, Hwaseong-si (KR); Myungkyu Lee, Seoul (KR); Sunghye Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/792,515

(22) Filed: Feb. 17, 2020

(65) Prior Publication Data
US 2020/0401476 A1 Dec. 24, 2020

(30) Foreign Application Priority Data
Jun. 19, 2019 (KR) .......................... 10-2019-0072725

(51) Int. Cl.
| | |
|---|---|
| *G06F 11/00* | (2006.01) |
| *G06F 11/10* | (2006.01) |
| *G06F 11/07* | (2006.01) |
| *G11C 11/408* | (2006.01) |
| *G06F 12/0882* | (2016.01) |
| *G06F 13/16* | (2006.01) |

(Continued)

(52) U.S. Cl.
CPC .......... *G06F 11/106* (2013.01); *G06F 11/076* (2013.01); *G06F 11/0772* (2013.01); *G06F 11/1068* (2013.01); *G06F 11/3037* (2013.01); *G06F 12/0882* (2013.01); *G06F 13/1673* (2013.01); *G11C 11/4082* (2013.01); *G11C 11/40615* (2013.01)

(58) Field of Classification Search
CPC ............ G06F 11/1008; G06F 11/1048; G06F 11/106; G06F 11/1068; G06F 12/0246; G06F 3/0619; G06F 2211/1088; G11C 29/52
See application file for complete search history.

(56) References Cited

U.S. PATENT DOCUMENTS

| | | | |
|---|---|---|---|
| 5,267,242 | A | 11/1993 | Lavallee et al. |
| 5,430,742 | A | 7/1995 | Jeddeloh et al. |
| 7,370,260 | B2 | 5/2008 | Nahas |

(Continued)

*Primary Examiner* — Christine T. Tu
(74) *Attorney, Agent, or Firm* — Harness, Dickey & Pierce, ,P.L.C.

(57) ABSTRACT

A semiconductor memory device includes a memory cell array, an error correction code (ECC) engine circuit, an error information register and a control logic circuit. The memory cell array includes memory cell rows. The control logic circuit controls the ECC engine circuit to generate an error generation signal based on performing a first ECC decoding on first sub-pages in a first memory cell row in a scrubbing operation and based on performing a second ECC decoding on second sub-pages in a second memory cell row in a normal read operation on the second memory cell row. The control logic circuit records error information in the error information register and controls the ECC engine circuit to skip an ECC encoding and an ECC decoding on a selected memory cell row of the first memory cell row and the second memory cell row based on the error information.

20 Claims, 20 Drawing Sheets

(51) Int. Cl.
*G11C 11/406* (2006.01)
*G06F 11/30* (2006.01)

(56) References Cited

U.S. PATENT DOCUMENTS

| | | |
|---|---|---|
| 8,145,961 B2 | 3/2012 | Amez et al. |
| 9,043,668 B2 | 5/2015 | Goss et al. |
| 9,189,330 B2 | 11/2015 | Lastras et al. |
| 9,727,412 B2 | 8/2017 | Son et al. |
| 10,127,101 B2 | 11/2018 | Halbert et al. |
| 2012/0159618 A1* | 6/2012 | Ohba .................. G06F 21/00 |
| 2019/0227732 A1* | 7/2019 | Jung .................. G06F 3/0652 |
| 2020/0233604 A1* | 7/2020 | Kazama .............. G06F 3/06 |

\* cited by examiner

| | RNK | ADDINF (BGA,BA,RA) | ECNT | FCWCNT | FG | PF |
|---|---|---|---|---|---|---|
| Idx1 | 2 | A | 2 | 2 | 0 | 0 |
| Idx2 | 1 | B | 4 | 3 | 0 | 1 |
| ⋮ | ⋮ | ⋮ | ⋮ | ⋮ | ⋮ | ⋮ |
| Idxu | 3 | X | 1 | 1 | 1 | 0 |
| | 581 | 582 | 583 | 584 | 585 | 586 |

SEMICONDUCTOR MEMORY DEVICES AND MEMORY SYSTEMS

CROSS-REFERENCE TO RELATED APPLICATIONS

This application claims the benefit of priority under 35 USC § 119 to Korean Patent Application No. 10-2019-0072725, filed on Jun. 19, 2019, in the Korean Intellectual Property Office, the disclosure of which is incorporated by reference in its entirety herein.

BACKGROUND

The present disclosure relates to memories, and more particularly to semiconductor memory devices and memory systems including the same.

Semiconductor memory devices may be classified into non-volatile memory devices, such as flash memory devices, and volatile memory devices, such as DRAMs. High speed operation and cost efficiency of DRAMs make it possible for DRAMs to be used for system memories. Due to the continuing shrinking in fabrication design rule of DRAMs, bit errors of memory cells in the DRAMs may rapidly increase and yield of the DRAMs may decrease.

SUMMARY

According to some example embodiments, a semiconductor memory device may include a memory cell array and an error correction code (ECC) engine circuit, an error information register, and a control logic circuit configured to control the ECC engine circuit. The memory cell array may include a plurality of memory cell rows. Each of the plurality of memory cell rows may include a plurality of dynamic memory cells. The control logic circuit may be configured to control the ECC engine circuit to cause the ECC engine circuit to generate an error generation signal based on performing a first ECC decoding on first sub-pages in at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row. The control logic circuit may be further configured to record error information in the error information register to control the ECC engine circuit to cause the ECC engine circuit to skip an ECC encoding operation and an ECC decoding operation on at least one selected memory cell row of the at least one first memory cell row and the at least one second memory cell row based on referring to the error information. The error information may at least indicate a quantity of error occurrences in the first memory cell row and the second memory cell row.

According to some example embodiments, a semiconductor memory device may include a memory cell array including a plurality of memory cell rows, each of the plurality of memory cell rows including a plurality of dynamic memory cells. The semiconductor memory device may further include an error correction code (ECC) engine circuit, a refresh control circuit configured to generate refresh row addresses one or more memory cell rows of the plurality of memory cell rows to be refreshed, a scrubbing control circuit configured to count the refresh row addresses and generate a scrubbing address that designates at least one first memory cell row of the plurality of memory cell rows, an error information register, and a control logic circuit configured to control the ECC engine circuit and the scrubbing control circuit. The control logic circuit may be configured to control the ECC engine circuit to cause the ECC engine circuit to generate an error generation signal based on performing a first ECC decoding on first sub-pages in the at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row. The control logic circuit may be further configured to record error information in the error information register and is configured to control the ECC engine circuit to cause the ECC engine circuit to skip an ECC encoding operation and an ECC decoding operation on at least one selected memory cell row of the at least one first memory cell row and the at least one second memory cell row based on referring to the error information. The error information may at least indicate a quantity of error occurrences in the first memory cell row and the second memory cell row.

According to some example embodiments, a memory system may include a semiconductor memory device and a memory controller configured to control the semiconductor memory device. The semiconductor memory device may include a memory cell array including a plurality of memory cell rows, each of the plurality of memory cell rows including a plurality of dynamic memory cells, and an error correction code (ECC) engine circuit, an error information register, and a control logic circuit configured to control the ECC engine circuit. The control logic circuit may be configured to control the ECC engine circuit to cause the ECC engine circuit to generate an error generation signal based on performing a first ECC decoding on first sub-pages in at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row. The control logic circuit may be further configured to record error information in the error information register and is configured to control the ECC engine circuit to cause the ECC engine circuit to skip an ECC encoding operation and an ECC decoding operation on at least one selected memory cell row of the at least one first memory cell row and the at least one second memory cell row based on referring to the error information. The error information may at least indicate a quantity of error occurrences in the first memory cell row and the second memory cell row. The control logic circuit may be configured to transmit error information associated with the at least one selected memory cell row as an error information signal to the memory controller.

Accordingly, a semiconductor memory device according to some example embodiments may include an ECC engine circuit, may obtain error information associated with permanent fault of some memory cell rows and some sub-pages based on information obtained during a scrubbing operation and a normal read operation on memory cell rows and transmits the error information associated with the permanent fault to a memory controller. Therefore, the memory controller may reduce or prevent uncorrectable errors, thereby improving functioning of a computing device (e.g., computer) that includes a memory system that includes the memory controller and the semiconductor device.

BRIEF DESCRIPTION OF THE DRAWINGS

Example embodiments will be described below in more detail with reference to the accompanying drawings.

FIG. 15 illustrates the error information register in the semiconductor memory device of FIG. 2 according to some example embodiments.

DETAILED DESCRIPTION

Various example embodiments will be described more fully hereinafter with reference to the accompanying drawings, in which example embodiments are shown.

Figure 1:
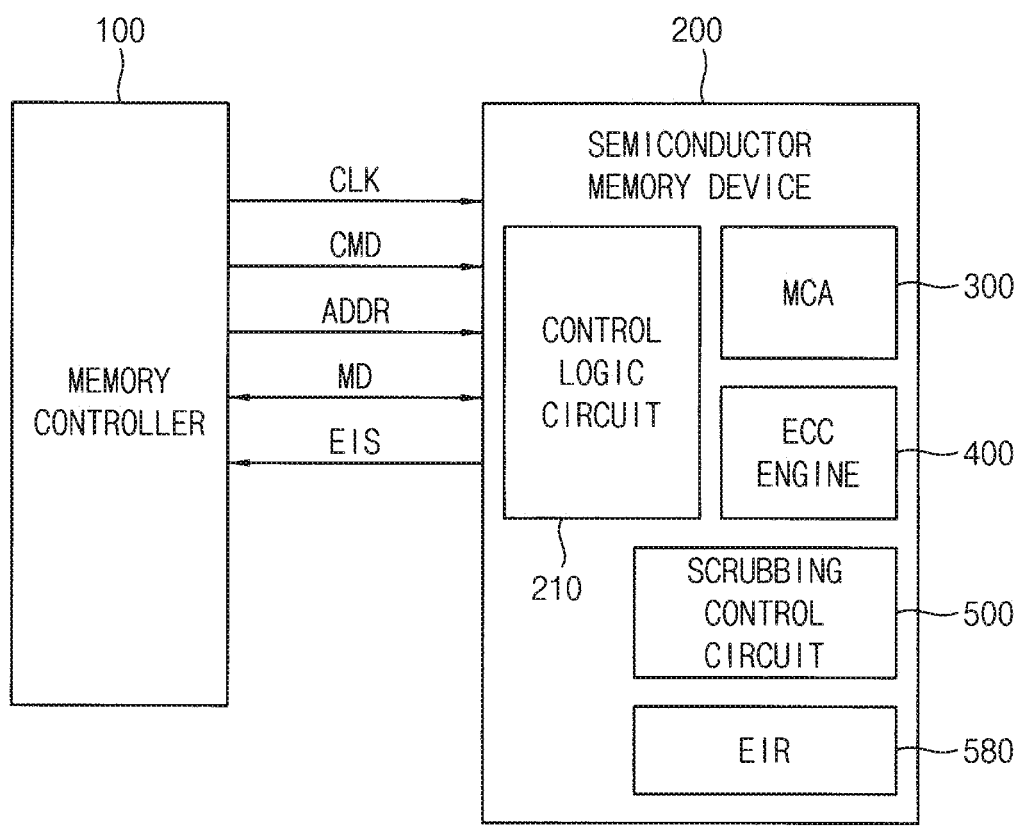
FIG. 1 is a block diagram illustrating a memory system according to some example embodiments.

FIG. 1 is a block diagram illustrating a memory system according to some example embodiments.

Referring to FIG. 1, a memory system 20 may include a memory controller 100 and a semiconductor memory device 200.

The memory controller 100 may control overall operation of the memory system 20. The memory controller 100 may control the semiconductor memory device 200. The memory controller 100 may control overall data exchange between an external host and the semiconductor memory device 200. For example, the memory controller 100 may write data in the semiconductor memory device 200 or read data from the semiconductor memory device 200 in response to a request from the host.

The memory controller 100 may be included in, may include, and/or may be implemented by, one or more instances of processing circuitry (also referred to herein interchangeably as integrated circuitry) such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of the memory controller 100.

In addition, the memory controller 100 may issue (e.g., transmit) operation commands to the semiconductor memory device 200 to control the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 may transmit a clock signal CLK, a command CMD, and an address (signal) ADDR to the semiconductor memory device 200 and exchanges main data MD with the semiconductor memory device 200.

The semiconductor memory device 200 may transmit an error information signal EIS to the memory controller 100.

The memory controller 100 may determine an error management policy on defective cells in the semiconductor memory device 200 based on the error information signal EIS.

The semiconductor memory device 200 includes a memory cell array 300 that stores the main data MD and parity bits, an error correction code (ECC) engine 400, a control logic circuit 210, a scrubbing control circuit 500 and an error information register 580. The ECC engine 400 may be interchangeably referred to herein as an ECC engine circuit and may be implemented by an instance of processing circuitry as described further below. The control logic circuit 210 may be configured to control at least the ECC engine 400. The memory cell array 300 may include a plurality of memory cell rows, and each memory cell row of the plurality of memory cell rows of the memory cell array 300 may include a plurality of dynamic memory cells MC.

In some example embodiments, at least some of the semiconductor memory device 200, including one or more, or all, of the control logic circuit 210, the ECC engine 400, the scrubbing control circuit 500, or the error information register 580 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of at least some of the semiconductor memory device 200, including one or more, or all, of the control logic circuit 210, the ECC engine 400, the scrubbing control circuit 500, or the error information register 580. In some example embodiments, the control logic circuit 210, the ECC engine 400, the scrubbing control circuit 500, or the error information register 580 may be implemented by separate processing circuities. In some example embodiments, two or more, or all, of control logic circuit 210, the ECC engine 400, the scrubbing control circuit 500, or the error information register 580 may be implemented by a same processing circuitry.

Figure 21:
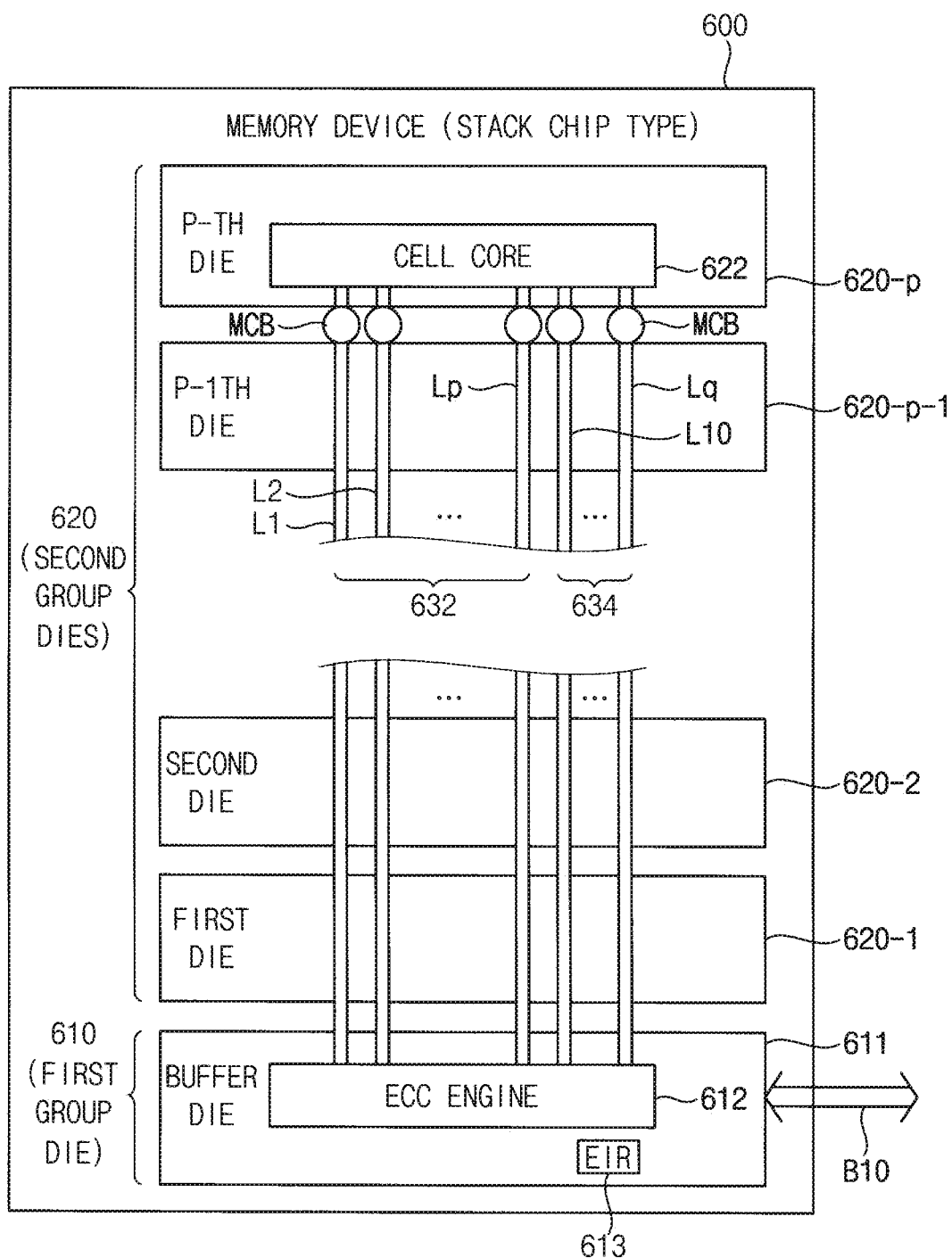
FIG. 21 is a block diagram illustrating a semiconductor memory device according to some example embodiments.
Figure 22:
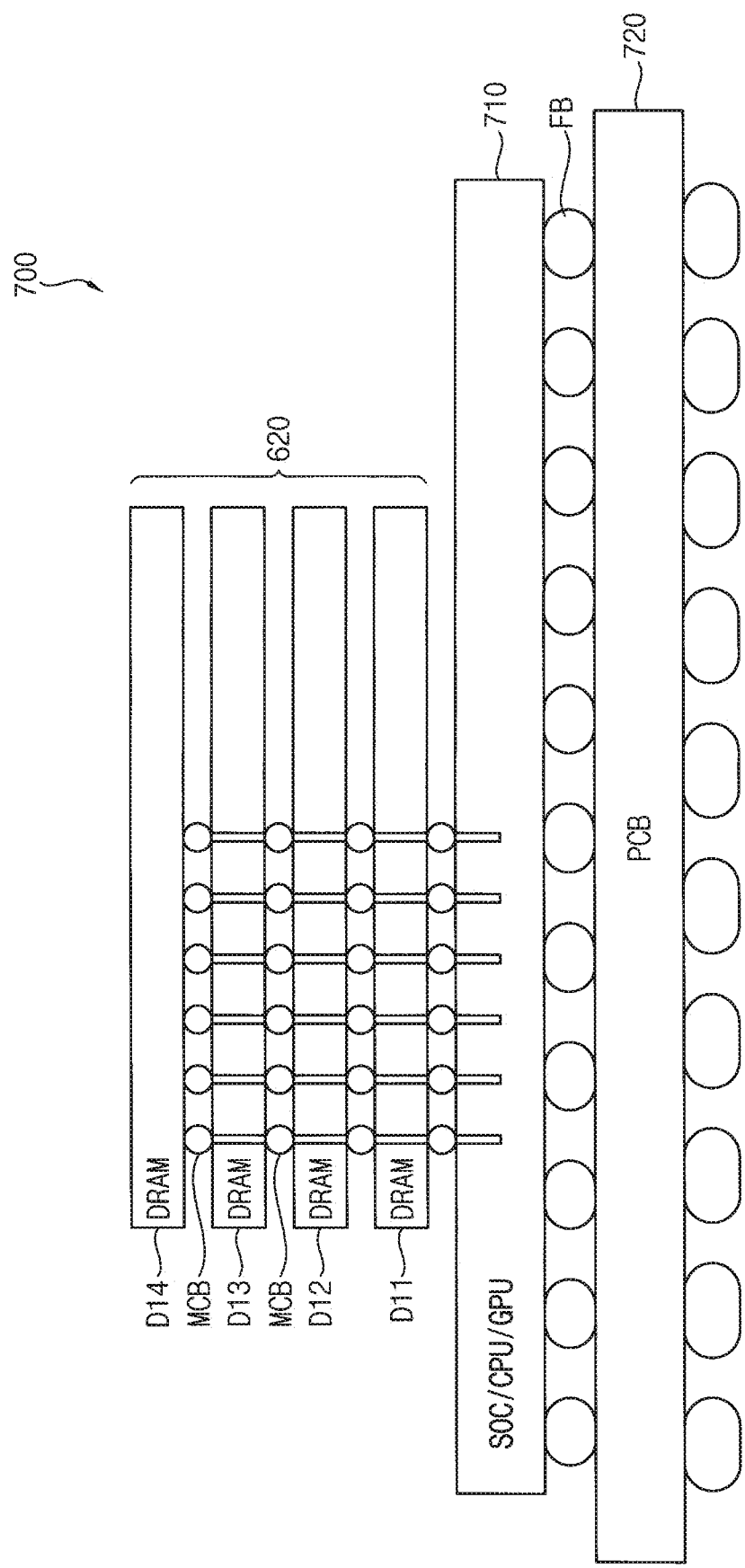
FIG. 22 is a cross-sectional view of a 3D chip structure employing the semiconductor memory device of FIG. 21 according to some example embodiments.

As described herein, it will be understood that any part of the semiconductor memory device 200 may be implemented, at least in part, by one or more instances of processing circuitry, and said any part of the semiconductor memory device 200 may be so implemented based on the semiconductor memory device 200 including one or more dies (e.g., any of the dies 610 and/or 620 of the semiconductor memory device 600 of FIGS. 21 and 22), which will be understood to include portions and/or blocks of semiconductor material that are fabricated to include one or more instances of integrated circuitry that are configured to implement some or all of one or more, or all, portions of the semiconductor memory device 200 according to any of the example embodiments described herein. For example, separate portions of the semiconductor memory device 200 as described with reference to FIGS. 1 and/or 2 may be implemented by separate dies (e.g., one or more dies 610 and/or one or more 620) based on said separate dies including separate instances of integrated circuitry that configure said separate dies to implement separate portions of the semiconductor memory device 200 (e.g., the ECC engine 400, the scrubbing control circuit 500, the error information register 580, the control logic circuit 210, the memory cell array 300, any combination thereof, or the like).

The ECC engine 400 (also referred to herein as an ECC engine circuit) may perform ECC encoding on a write data to be stored in a target memory cell row (a target page) of the memory cell array 300, and may perform ECC decoding or decoding on a codeword read from the target page under control of the control logic circuit 210.

The scrubbing control circuit 500 may generate scrubbing addresses that designate at least one sub-page in at least one first memory cell row of the memory cell rows on which a scrubbing operation is to be performed, such that a scrubbing operation is performed on at least a first memory cell row of a plurality of memory cell rows in the memory cell array 300 that is at least partially designated by the scrubbing addresses. The control logic circuit 210 may control the scrubbing control circuit 500.

During the scrubbing operation, the control logic circuit 210 may control the ECC engine 400 such that the ECC engine 400 reads data corresponding to a first codeword, from at least one sub-page, designated by the scrubbing address, in the selected memory cell row, corrects at least one error bit in the first codeword and writes back the corrected first codeword in a memory location in which the first data are stored. Accordingly, the control logic circuit 210 may control the ECC engine 400 to cause the ECC engine 400 to perform a first ECC decoding operation based on reading data corresponding to a first codeword from each of the first sub-pages and based on correcting at least one error bit in the first codeword and to perform a scrubbing operation based on writing back the corrected first codeword in a memory location of the memory cell array 300 in which each of the first sub-pages are stored.

During a normal read operation, the control logic circuit 210 may control the ECC engine 400 to perform an ECC decoding (e.g., first ECC decoding) on sub-pages in at least a second memory cell row of the memory cell rows in the memory cell array 300. The ECC engine 400 may generate an error generation signal based on performing the ECC decoding.

Accordingly, it will be understood that the control logic circuit 210 may control the ECC engine 400 to generate an error generation signal based on performing a ECC decoding (e.g., first ECC decoding) on first sub-pages in at least one first memory cell row of the memory cell rows in a scrubbing operation on the at least one first memory cell row and based on performing a second ECC decoding on second sub-pages in at least one second memory cell row of the memory cell rows in a normal read operation on the at least one second memory cell row.

The control logic circuit 210 may record an error information at least including (e.g., indicating) at least a number (e.g., quantity) of error occurrences in the first memory cell row and the second memory cell row. Accordingly, it will be understood that the control logic circuit 210 may record error information in the error information register 580.

Figure 2:
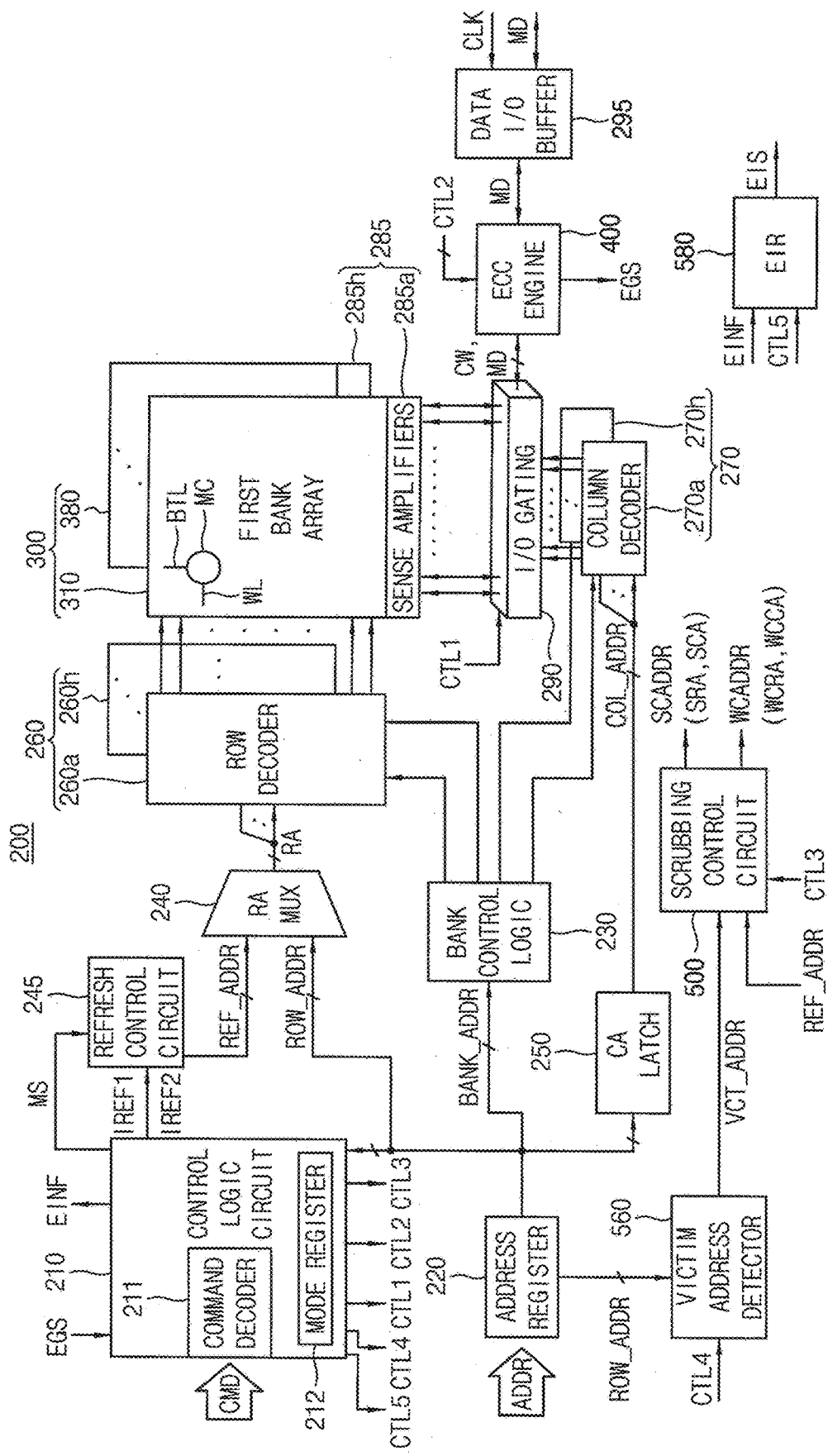
FIG. 2 is a block diagram illustrating the semiconductor memory device in FIG. 1 according to some example embodiments.

FIG. 2 is a block diagram illustrating the semiconductor memory device 200 in FIG. 1 according to some example embodiments.

Referring to FIG. 2, the semiconductor memory device 200 includes the control logic circuit 210, an address register 220, a bank control logic 230, a refresh control circuit 245, a row address multiplexer 240, a column address latch 250, a row decoder 260, a column decoder 270, the memory cell array 300, a sense amplifier unit 285, an I/O gating circuit 290, the ECC engine 400, the scrubbing control circuit 500, a victim address detector 560, an error information register 580 and a data I/O buffer 295.

In some example embodiments, at least some elements of the semiconductor memory device 200 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of at least some elements of the semiconductor memory device 200. In some example embodiments, two or more elements of the semiconductor memory device 200 may be implemented by separate processing circuitries or a same processing circuitry.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL. The memory cells MC may be dynamic memory cells.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh control circuit 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The refresh control circuit 245 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may apply the first refresh control signal IREF1 to the refresh control circuit 245 whenever the control logic circuit 210 receives the auto refresh command.

When the command CMD from the memory controller 100 corresponds to a self-refresh entry (SRE) command, the control logic circuit 210 may applies the second refresh control signal IREF2 to the refresh control circuit 245 and the second refresh control signal IREF2 is activated from a time point when the control logic circuit 210 receives the self-refresh entry command to a time point when control logic circuit 210 receives a self-refresh exit (SRX) command. The refresh control circuit 245 may sequentially increase or decrease the refresh row address REF_ADDR in response to receiving the first refresh control signal IREF1 or during the second refresh control signal IREF2 is activated. Accordingly, the refresh control circuit 245 may generate refresh row addresses REF_ADDR to cause one or more, or all, memory cell rows of the plurality of memory cell rows of the memory cell array 300 to be refreshed in response to a command received from the memory controller 100 (e.g., an auto refresh command received at the control logic circuit 210 from the memory controller 100).

The activated one of the first through eighth bank row decoders 260a~260h, by the bank control logic 230, decodes the row address RA that is output from the row address multiplexer 240 or a target scrubbing row address TSRA, and activates a word-line corresponding to the row address RA or the target scrubbing row address TSRA. For example, the activated bank row decoder applies a word-line driving voltage to the word-line corresponding to the row address RA or the target scrubbing row address TSRA.

The column address latch 250 receives the column address COL_ADDR from the address register 220, and temporarily stores the received column address COL_ADDR. In some embodiments, in a burst mode, the column address latch 250 generates column addresses COL_ADDR' that increment from the received column address COL_ADDR. The column address latch 250 applies the temporarily stored or generated column address COL_ADDR' to the first through eighth bank column decoders 270a~270h.

The activated one of the first through eighth bank column decoders 270a~270h activates a sense amplifier corresponding to the bank address BANK_ADDR and the column address COL_ADDR' or a target scrubbing column address TSCA through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380. As an example, the I/O gating circuit 290 may have first through eighth bank I/O gating circuits 290a~290h respectively coupled to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310~380 may be provided to the data I/O buffer 295 from the memory controller 100, may be provided to the ECC engine 400 from the data I/O buffer 295, the ECC engine 400 may perform an ECC encoding on the main data MD to generate parity bits, the ECC engine 400 may provide the main data MD and the parity bits to the I/O gating circuit 290 and the I/O gating circuit 290 may write the main data MD and the parity bits in a sub-page of a target page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The ECC engine 400 performs an ECC decoding on a codeword read from a sub-page of the target page and may provide an error generation signal EGS to the control logic circuit 210 with correcting at least one error bit when the at least one error bit is detected in the main data MD in the codeword in a scrubbing operation or a normal read operation of the semiconductor memory device 200. The control logic circuit 210 may control the ECC engine (e.g., via control signal CTL2) to cause the ECC engine 400 to generate the error generation signal EGS. The control logic circuit 210 may record a row address and a column address of the codeword including the at least one error bit, in the error information register 580 as an error information EINF.

The scrubbing control circuit 500 may count the refresh row address REF_ADDR which sequentially changes and may output (e.g., generate) a normal scrubbing address SCADDR whenever (e.g., in response to) the scrubbing control circuit 500 counts K refresh row addresses. Here, K is a natural number greater than one. The normal scrubbing address SCADDR may include a scrubbing row address SRA and a scrubbing column address SCA. The scrubbing control circuit 500 may provide the scrubbing row address SRA and the scrubbing column address SCA to the row decoder 260 and the column decoder 270, respectively in a first scrubbing mode. In some example embodiments, the scrubbing control circuit 500 may sequentially generate the normal scrubbing address SCADDR designating L codewords included in a first memory cell row of the plurality of memory cell rows, where L is a natural number equal to or greater than 1 and smaller than K.

The victim address detector 560 may count a number (e.g., quantity) of accesses to a first memory region in the memory cell array 300 to generate at least one victim address VCT_ADDR designating at least one adjacent memory region adjacent to the first memory region when (e.g., in response to a determination that) the number of the counted accesses reaches a threshold value (e.g., the reference number (e.g., quantity) of times during a reference interval). The at least one victim address VCT_ADDR may be stored in the address storing table of the scrubbing control circuit 500.

The scrubbing control circuit 500, in a second scrubbing mode, may output an address of codeword associated with the at least one victim address VCT_ADDR stored in the address storing table as at least one weak codeword address WCADDR. The weak codeword address WCADDR may include a weak codeword row address WCRA and a weak codeword column address WCCA. The scrubbing control circuit 500 may provide the weak codeword row address WCRA and the weak codeword column address WCCA to the row decoder 260 and the column decoder 270, respectively in the second scrubbing mode.

Accordingly, it will be understood that the victim address detector 560 may provide at least one victim address VCT_ADDR to the scrubbing control circuit 500, and the scrubbing control circuit 500 may store the at least one victim address VCT_ADDR in an address storing table therein as at least one weak codeword address WCADDR.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290, a second control signal CTL2 to control the ECC engine 400 (e.g., to cause the ECC engine to generate an error generation signal EGS), a third control signal CTL3 to control the scrubbing control circuit 500, a fourth control signal CTL4 to control the victim address detector 560 and a fifth control signal CTL5 to control the error information register 580. In addition, the control logic circuit 210 may provide the refresh control circuit 245 with a mode signal associated with a refresh period.

The control logic circuit 210 may generate the mode signal MS based on a temperature signal representing an operating temperature of the semiconductor memory device 200.

The error information register 580 may provide (transmit) an information associated with permanent error of the error information EINF to the memory controller 100 as the error information signal EIS. The error information register 580 may transmit the error information signal EIS to the memory controller 100 via one of a dedicated pin or a data I/O pin in response to the fifth control signal CTL5.

Figure 3:
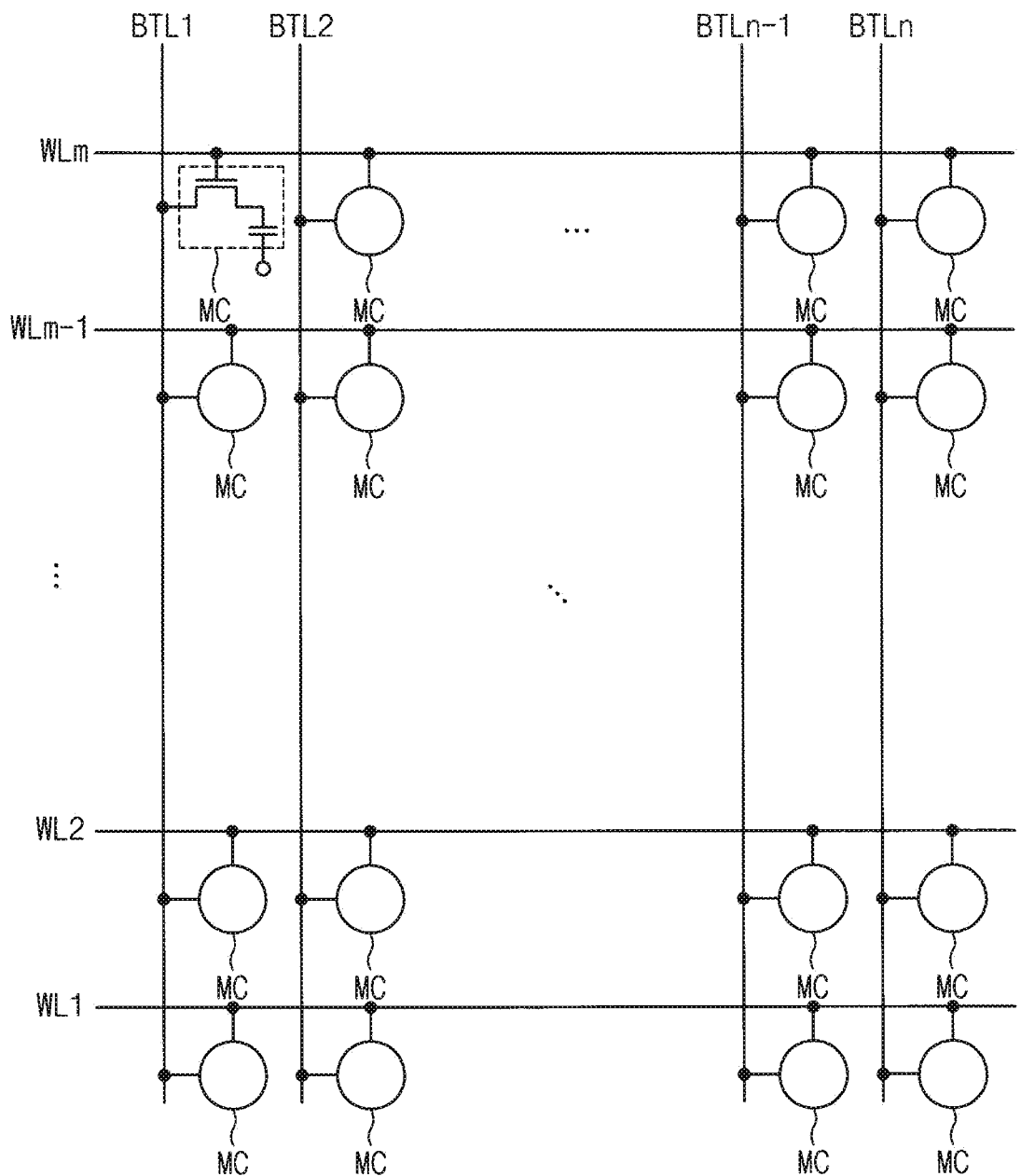
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WLm (m is a natural number equal to or greater than two), a plurality of bit-lines BTL1~BTLn (n is a natural number equal to or greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

Figure 4:
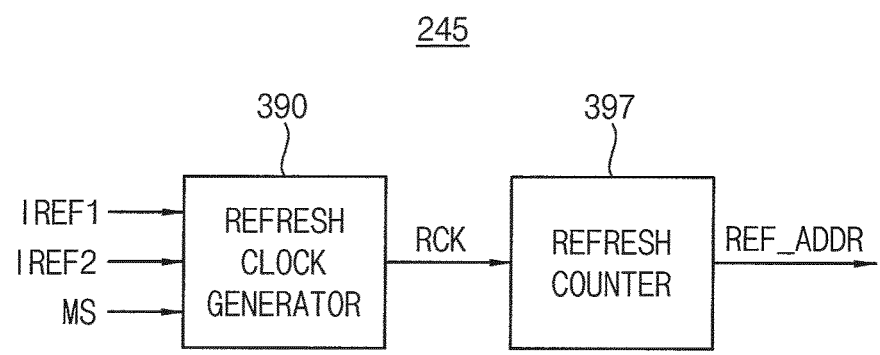
FIG. 4 is a block diagram illustrating the refresh control circuit in the semiconductor memory device of FIG. 2 according to some example embodiments.

FIG. 4 is a block diagram illustrating the refresh control circuit in the semiconductor memory device of FIG. 2 according to some example embodiments.

Referring to FIG. 4, the refresh control circuit 245 may include a refresh clock generator 390 and a refresh counter 397.

In some example embodiments, some or all elements of the refresh control circuit 245 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the refresh control circuit 245. In some example embodiments, two or more, or all, elements of the refresh control circuit 245 may be implemented by a separate or same processing circuitries.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or during the second refresh control signal IREF2 is activated.

The refresh counter 397 may generate the refresh row address REF_ADDR designating sequentially the memory cell rows by performing counting operation at the period of the refresh clock signal RCK.

Figure 5:
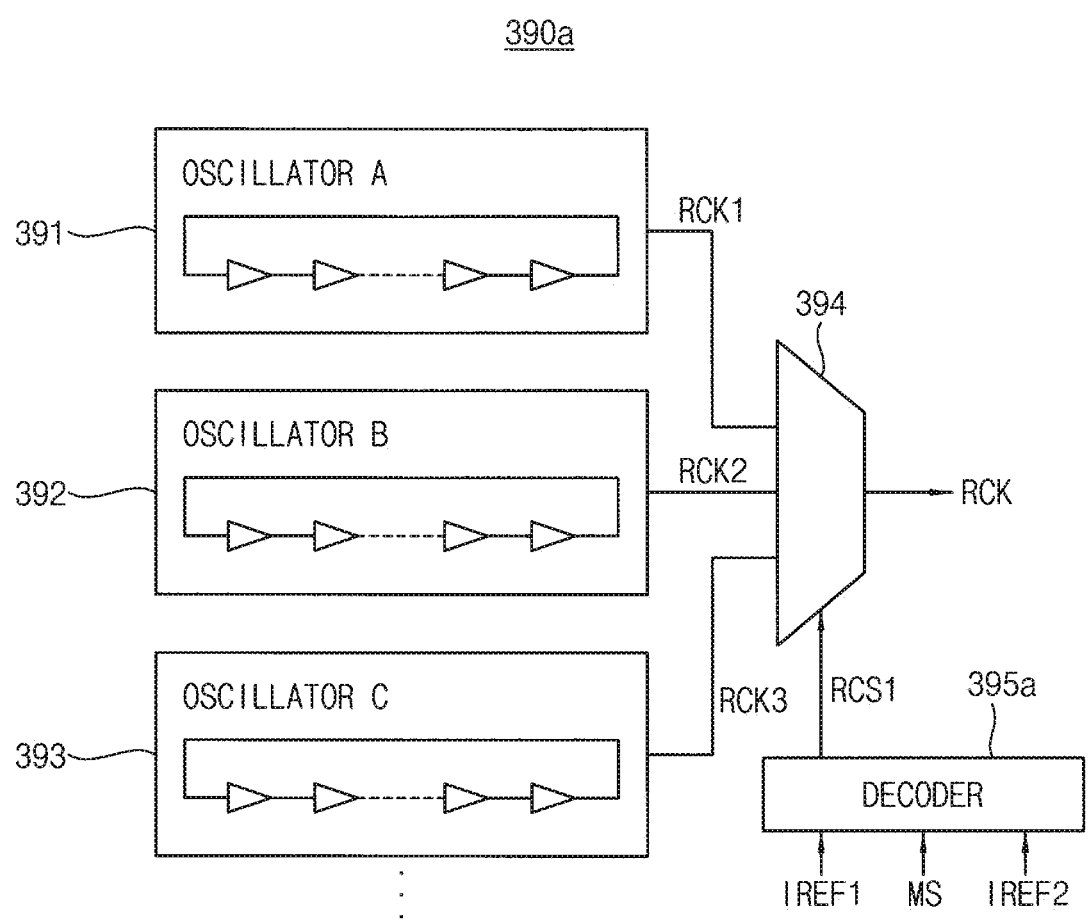
FIG. 5 is a circuit diagram illustrating an example of the refresh clock generator shown in FIG. 4 according to some example embodiments.

FIG. 5 is a circuit diagram illustrating an example of the refresh clock generator 390 shown in FIG. 4 according to some example embodiments.

Referring to FIG. 5, a refresh clock generator 390a may include a plurality of oscillators 391, 392 and 393, a multiplexer 394 and a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 selects one of the refresh clock signals RCK1, RCK2 and RCK3 to provide the refresh clock signal RCK in response to the clock control signal RCS1.

In some example embodiments, some or all elements of the refresh clock generator 390a may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the refresh clock generator 390a. In some example embodiments, two or more, or all, elements of the refresh clock generator 390a may be implemented by a separate or same processing circuitries.

Figure 6:
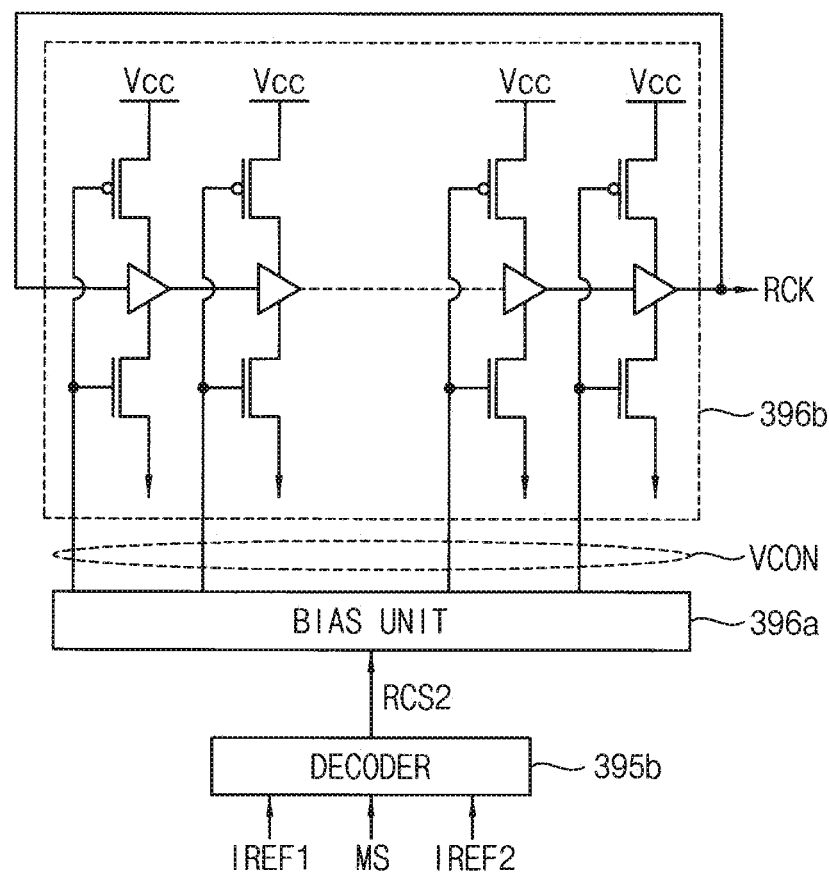
FIG. 6 is a circuit diagram illustrating another example of the refresh clock generator in FIG. 4 according to some example embodiments.

FIG. 6 is a circuit diagram illustrating another example of the refresh clock generator 390 in FIG. 4 according to some example embodiments.

Referring to FIG. 6, a refresh clock generator 390b may include a decoder 395b, a bias unit 396a and an oscillator 396b. The decoder 395b may decode the first refresh control signal IREF1, the second refresh control signal IREF2 and the mode signal MS to output a clock control signal RCS2. The bias unit 396a generates a control voltage VCON in response to the clock control signal RCS2. The oscillator 396b generates the refresh pulse signal RCK having a variable period, according to the control voltage VCON.

In some example embodiments, some or all elements of the refresh clock generator 390b may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the refresh clock generator 390b. In some example embodiments, two or more, or all, elements of the refresh clock generator 390b may be implemented by a separate or same processing circuitries.

Figure 7:
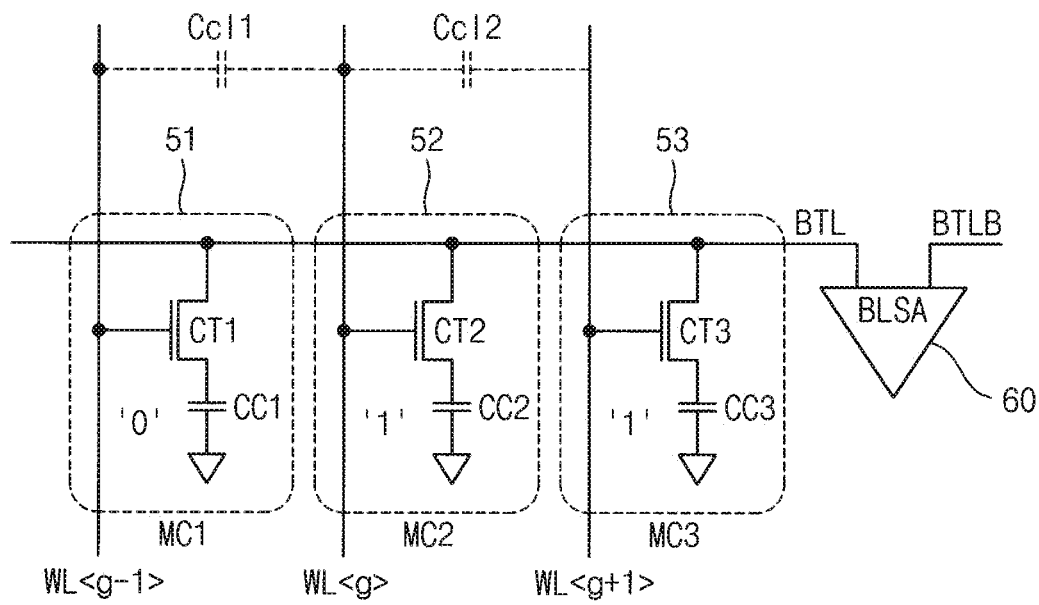
FIG. 7 is a circuit diagram illustrating disturbance between memory cells of a semiconductor memory device.

FIG. 7 is a circuit diagram illustrating disturbance between memory cells of a semiconductor memory device.

Referring to FIG. 7, a part of the semiconductor memory device 200 includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<g−1>, the memory cell 52 is connected to a word-line WL<g>, and the memory cell 53 is connected to a word-line WL<g+1>. As shown in FIG. 7, the word-lines WL<g−1> and WL<g+1> are located adjacent to the word-line WL<g>. The memory cell 51 includes an access transistor CT1 and a cell capacitor CC1. A gate terminal of the access transistor CT1 is connected to the word-line WL<g−1> and its one terminal is connected to the bit-line BTL. The memory cell 52 includes an access transistor CT2 and a cell capacitor CC2. A gate terminal of the access transistor CT2 is connected to the word-line WL<g> and its one terminal is connected to the bit-line BTL. Also, the memory cell 53 includes an access transistor CT3 and a cell capacitor CC3. A gate terminal of the access transistor ST3 is connected to the word-line WL<g+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<g>. Then, due to capacitive coupling effect, a voltage of adjacent word-lines WL<g−1> and WL<g+1> rises even when no select voltage is applied to the adjacent word-lines WL<g−1> and WL<g+1>. Such capacitive coupling is indicated with parasitic capacitances Cc11 and Cc21.

During no refresh operation, when the word-line WL<g> is accessed repeatedly, charges stored in the cell capacitors CC1 and CC3 of the memory cells 51 and 53 connected to the word-lines WL<g−1> and WL<g+1> may leak gradually. In this case, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 8:
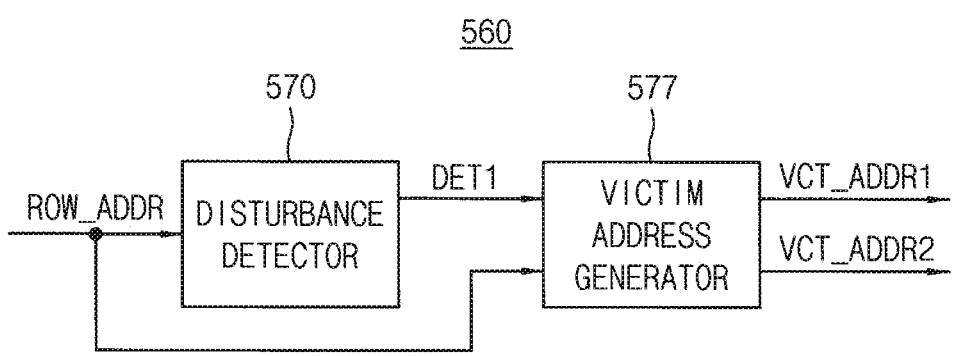
FIG. 8 is a block diagram illustrating an example of the victim address detector in the semiconductor memory device of FIG. 2 according to some example embodiments.

FIG. 8 is a block diagram illustrating an example of the victim address detector 560 in the semiconductor memory device of FIG. 2 according to some example embodiments.

Referring to FIG. 8, the victim address detector 560 may include a disturbance detector 570 and a victim address generator 577.

In some example embodiments, some or all elements of the victim address detector 560 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the victim address detector 560. In some example embodiments, two or more, or all, elements of the victim address detector 560 may be implemented by a separate or same processing circuitries.

The disturbance detector 570 may count a number of accesses to a first memory region (i.e., at least one memory cell row) based on the row address ROW_ADDR and may generate a first detection signal DET1 when the number of the counted accesses reaches a reference number of times during a reference (or predetermined) interval.

The victim address generator 577 may generate at least one of first and second victim addresses VCT_ADDR1 and VCT_ADDR2 in response to the first detection signal DET1. The at least one of first and second victim addresses VCT_ADDR1 and VCT_ADDR2 may be a row address designating a second memory region or a third memory region which are located adjacent to the first memory region. The victim address generator 577 may provide the at least one of first and second victim addresses VCT_ADDR1 and VCT_ADDR2 to an address storing table in the scrubbing control circuit 500.

Figure 9:
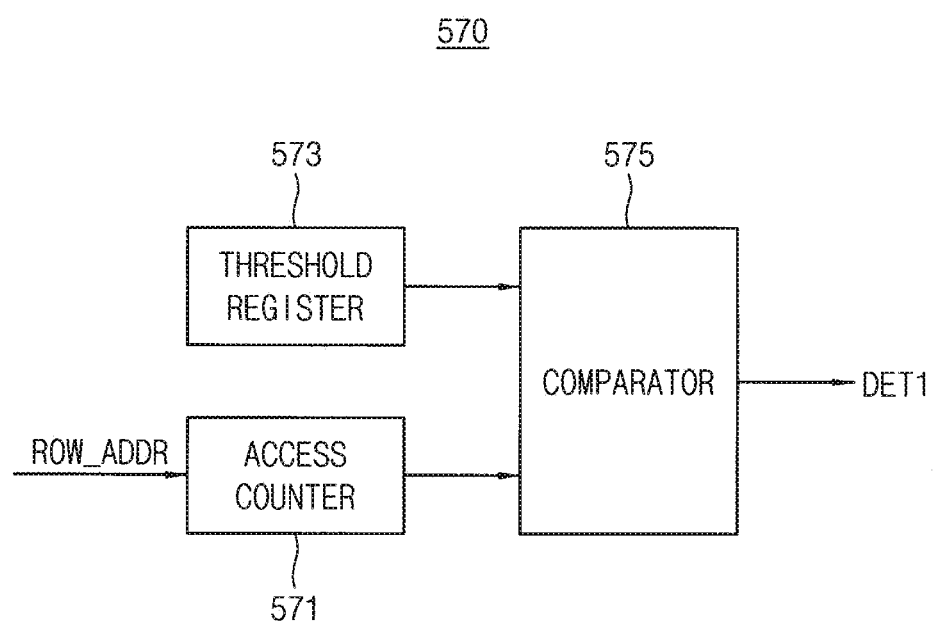
FIG. 9 is a block diagram illustrating the disturbance detector in the victim address detector of FIG. 8.

FIG. 9 is a block diagram illustrating the disturbance detector 570 in the victim address detector of FIG. 8.

Referring to FIG. 9, the disturbance detector 570 may include access counter 571, a threshold register 573 and a comparator 575.

In some example embodiments, some or all elements of the disturbance detector 570 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the disturbance detector 570. In some example embodiments, two or more, or all, elements of the disturbance detector 570 may be implemented by a separate or same processing circuitries.

The access counter 571 may count a number of accesses to a specified address (or a specified memory region) based on the row address ROW_ADDR in a predetermined period. For example, the access counter 571 may count a number of accesses to a specified word-line in the predetermined period. The number of accesses may be counted on a specific word-line or a word-line group including at least two word-lines. Moreover, a count of the number of accesses may be performed by a memory unit, for example, a specific block unit, a bank unit, or a chip unit.

The threshold register 573 may store a maximum disturbance occurrence count that guarantees the reliability of data in a specific word-line or a memory unit. For example, a threshold (or a reference number of times) on one word-line may be stored in the threshold register 573. Alternatively, a threshold on one word line group, one block, one bank unit, or one chip unit may be stored in the threshold register 573.

The comparator 575 may compare the reference number of times stored in the threshold register 573 with the number of accesses to a specific memory region counted by the access counter 571. If there is a memory region where the counted number of accesses reaches the reference number of times, the comparator 575 generates the first detection signal DET1. The comparator 575 provides the first detection signal DET1 to the victim address generator 577.

The victim address generator 577 receives the row address ROW_ADDR and generates the at least one of first and second victim addresses VCT_ADDR1 and VCT_ADDR2 in response to the first detection signal DET1.

Figure 10:
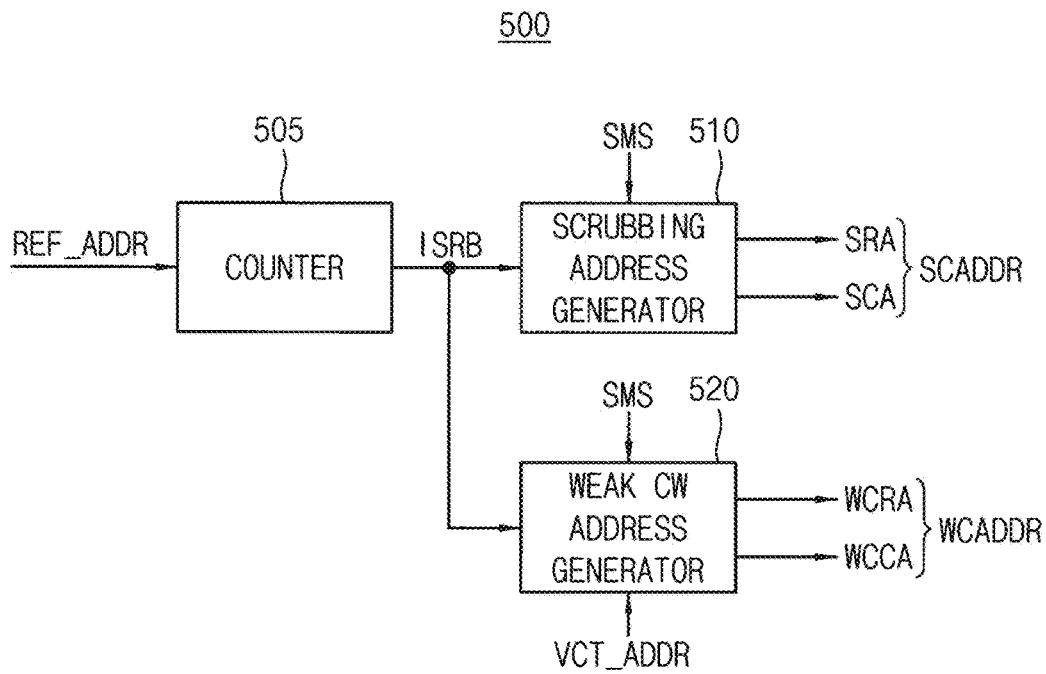
FIG. 10 is a block diagram illustrating an example of the scrubbing control circuit in the semiconductor memory device of FIG. 2 according to some example embodiments.

FIG. 10 is a block diagram illustrating an example of the scrubbing control circuit 500 in the semiconductor memory device of FIG. 2 according to some example embodiments.

Referring to FIG. 10, the scrubbing control circuit 500 may include a counter 505, a scrubbing address generator 510 and a weak codeword address generator 520.

In some example embodiments, some or all elements of the scrubbing control circuit 500 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the scrubbing control circuit 500. In some example embodiments, two or more, or all, elements of the scrubbing control circuit 500 may be implemented by a separate or same processing circuitries.

The counter 505 counts the refresh row address REF_ADDR to generate an internal scrubbing signal ISRB which is activated during a first interval when the counter 505 counts the refresh row address REF_ADDR by a number designated by a counting control signal CCS (not shown). The first interval may correspond to a time interval for refreshing one memory cell row. In some example embodiments, the counter 505 is configured to activate the internal scrubbing signal ISRB in response to the counter 505 counting K refresh row addresses REF_ADDR of the refresh row addresses REF_ADDR.

The scrubbing address generator 510 generates a normal scrubbing address SCADDR associated with a normal scrubbing operation for codewords in each of the memory cell rows (e.g., at least one selected memory cell row for which an EC encoding operation and an ECC decoding operation is skipped by the ECC engine 400), which gradually changes in the first scrubbing mode, in response to the internal scrubbing signal ISRB and the scrubbing mode signal SMS. For example, scrubbing address generator 510 may generate a normal scrubbing address associated with a normal scrubbing operation for the at least one selected memory cell row (for which an EC encoding operation and an ECC decoding operation is skipped by the ECC engine 400) in a first scrubbing mode, in response to the internal scrubbing signal ISRB and a scrubbing mode signal SMS.

The normal scrubbing address SCADDR includes a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

The weak codeword address generator 520 generates a weak codeword address WCADDR associated with a weak scrubbing operation associated with weak codewords in the bank array in the second scrubbing mode, in response to the internal scrubbing signal ISRB and the scrubbing mode signal SMS. For example, the weak codeword address generator 520 may generate a weak codeword address WCADDR associated with a weak scrubbing operation associated with weak codewords in the at least one selected memory cell row (for which an EC encoding operation and an ECC decoding operation is skipped by the ECC engine 400) in a second scrubbing mode, in response to the internal scrubbing signal ISRB and the scrubbing mode signal SMS. The weak codeword address WCADDR includes a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level different from the first logic level. The scrubbing mode signal SMS may be included in the third control signal CTL3. The weak codeword address generator 520 provides the weak codeword row address WCRA to a corresponding row decoder and provides the weak codeword column address WCCA to a corresponding column decoder.

The weak codeword address generator 520 may include an address storing table therein and the address storing table may store address information (e.g., corresponding addresses) of codewords associated with the victim address VCT_ADDR.

The scrubbing operation performed based on the weak codeword address WCADDR may be referred to as a weak scrubbing operation because the scrubbing operation performed based on the weak codeword address WCADDR is performed on weak codewords included in the memory cell array 300.

Figure 11:
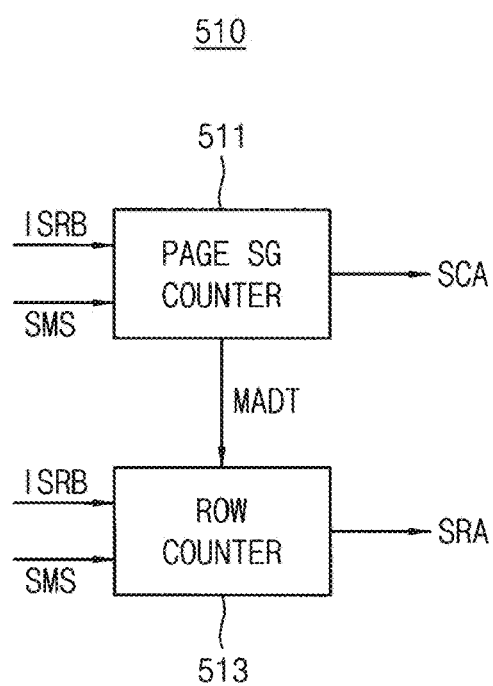
FIG. 11 is a block diagram illustrating the scrubbing address generator in the scrubbing control circuit of FIG. 10 according to some example embodiments.

FIG. 11 is a block diagram illustrating the scrubbing address generator in the scrubbing control circuit of FIG. 10 according to some example embodiments.

Referring to FIG. 11, the scrubbing address generator 510 may include a page segment counter 511 and a row counter 513.

In some example embodiments, some or all elements of the scrubbing address generator 510 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the scrubbing address generator 510. In some example embodiments, two or more, or all, elements of the scrubbing address generator 510 may be implemented by a separate or same processing circuitries.

The page segment counter 511 increases the scrubbing column address SCA by one while the internal scrubbing signal ISRB is activated in the first scrubbing mode and actives a maximum address detection signal MADT with being reset whenever the scrubbing column address SCA reaches its maximum value, in response to the internal scrubbing signal ISRB and the scrubbing mode signal SMS. The page segment counter 511 provides the maximum address detection signal MADT to the row counter 513.

The row counter 513 starts counting operation by receiving the internal scrubbing signal ISRB initially and increases the scrubbing row address SRA by one whenever the activated maximum address detection signal MADT in response to the internal scrubbing signal ISRB and the scrubbing mode signal SMS. Since the internal scrubbing signal ISRB is activated during the first interval while a refresh operation is not performed on one memory cell row, the page segment counter 511 may generate the scrubbing column address SCA associated with codewords in one page during the first interval.

Figure 12:
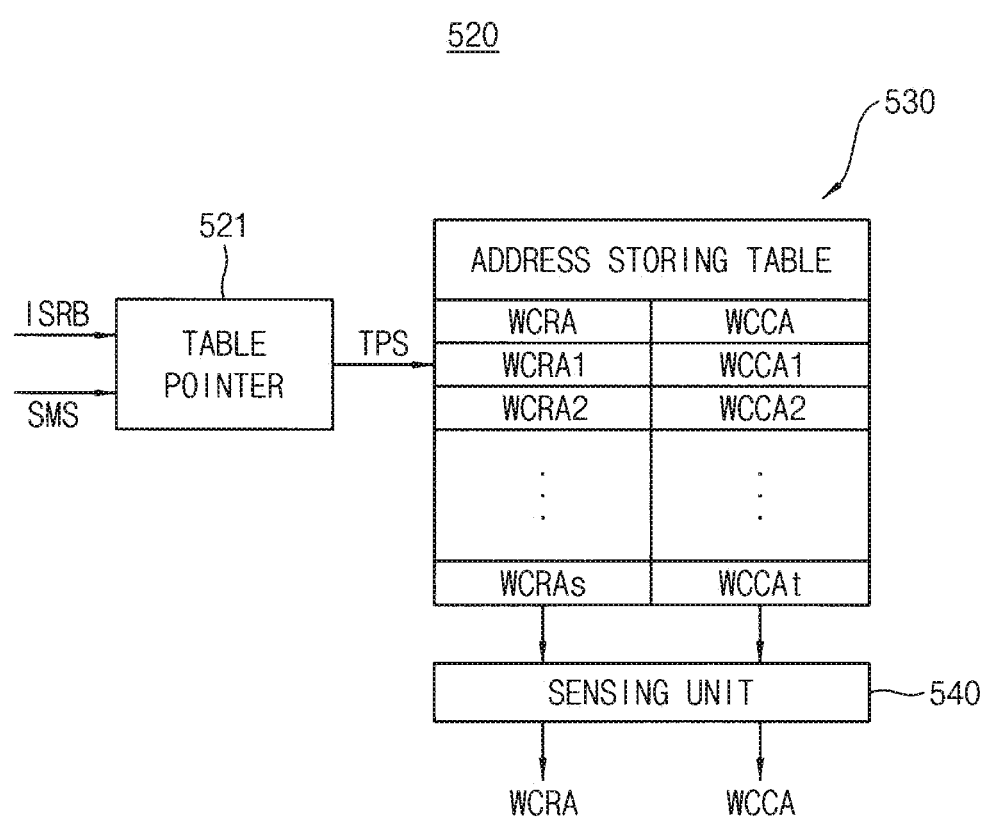
FIG. 12 illustrates the weak codeword address generator in the scrubbing control circuit of FIG. 10 according to some example embodiments.

FIG. 12 illustrates the weak codeword address generator 520 in the scrubbing control circuit of FIG. 10 according to some example embodiments.

Referring to FIG. 12, the weak codeword address generator 520 may include a table pointer 521, an address storing table 530 and a sensing unit 540.

In some example embodiments, some or all elements of the weak codeword address generator 520 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the weak codeword address generator 520. In some example embodiments, two or more, or all, elements of the weak codeword address generator 520 may be implemented by a separate or same processing circuitries.

The address storing table 530 stores address information WCRA1~WCRAs (s is a natural number greater than 1) and WCCA1~WCCAt (t is a natural number greater than 1) of weak codewords included in the memory cell array 300. The address information WCRA1~WCRAs is designated as the weak codeword row addresses and address information WCCA1~WCCAt is designated as the weak codeword column addresses. The weak codewords may be all or some of a weak page including a number of error bit greater than a reference value among pages in the first bank array 310. In addition, the weak codewords may be codewords of neighbor pages adjacent to the intensively accessed memory region. Accordingly, it will be understood that the address storing table 530 may store address information associated with the weak codewords, for example address information that indicates corresponding addresses (e.g., WCRA1~WCRAs and/or WCCA1~WCCAt) of the weak codewords.

The table pointer 521 may generate a pointer signal TPS which provides location information associated with the address storing table 530 in response to the internal scrubbing signal ISRB and the scrubbing mode signal SMS during the first interval in the second scrubbing mode, and provides the pointer signal TPS to the address storing table 530. The address storing table 530 may include a nonvolatile storage. The at least one of first and second victim addresses VCT_ADDR1 and VCT_ADDR2 provided from the victim address generator 577 in FIG. 8 may be stored in the address storing table 530.

The pointer signal TPS gradually increases by a predetermined time period during the first interval and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder and provides the weak codeword column address WCCA to a corresponding column decoder.

For example, when the ECC engine 400 performs the scrubbing operation on a particular memory cell row for a plurality of times and at least one error bit is detected in a read operation on the particular memory cell row, the control logic circuit 210 determines the particular memory cell row to have a permanent fault. If the particular memory cell row having the permanent fault is not replaced, error bits accumulates in the particular memory cell row and uncorrectable error may occur in the particular memory cell row. Therefore, the control logic circuit 210 or the memory controller 100 may replace the particular memory cell row having the permanent fault with a redundancy memory cell row through a repair operation. Therefore, the semiconductor memory device 200 may be configured to enable the reduction or prevention of uncorrectable errors, thereby improving functioning of a computing device (e.g., computer) that includes a memory system 20 that includes at least semiconductor memory device 200 and may further include the memory controller 100.

Figure 13:
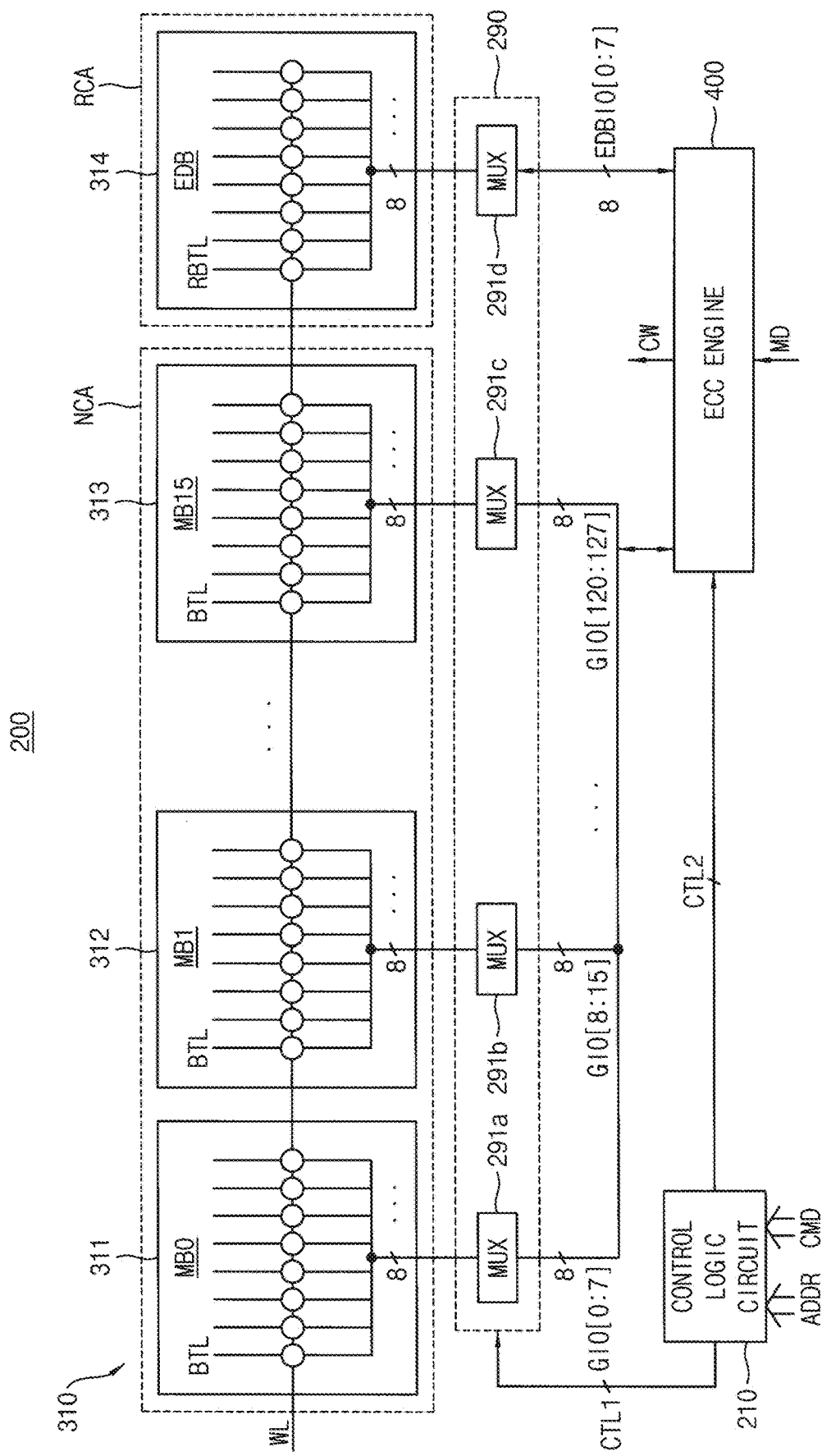
FIG. 13 illustrates a portion of the semiconductor memory device of FIG. 2 in a write operation.

FIG. 13 illustrates a portion of the semiconductor memory device of FIG. 2 in a write operation.

In FIG. 13, the control logic circuit 210, the first bank array 310, the I/O gating circuit 290, and the ECC engine 400 are illustrated.

Referring to FIG. 13, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The I/O gating circuit 290 includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

Although FIG. 13 illustrates an example in which sense amplifiers are not disclosed, the first bank sense amplifiers 285a may be coupled between the first bank array 310 and the I/O gating circuit 290.

The ECC engine 400 may be connected to the switching circuits 291a~291d through first data lines GIO[0:127] and second data lines EDBIO[0:15]. The control logic circuit 210 may receive the command CMD and the address ADDR and may decode the command CMD to generate the first control signal CTL1 for controlling the switching circuits 291a~291d and the second control signal CTL2 for controlling the ECC engine 400.

When the command CMD is a write command, the control logic circuit 210 provides the second control signal CTL2 to the ECC engine 400 and the ECC engine 400 performs the ECC encoding on the main data MD to generate parity bits associated with the main data MD and provides the I/O gating circuit 290 with the codeword CW including the main data MD and the parity bits. The control logic circuit 210 provides the first control signal CTL1 to the I/O gating circuit 290 such that the codeword CW is to be stored in a sub-page of the target page in the first bank array 310.

Figure 14:
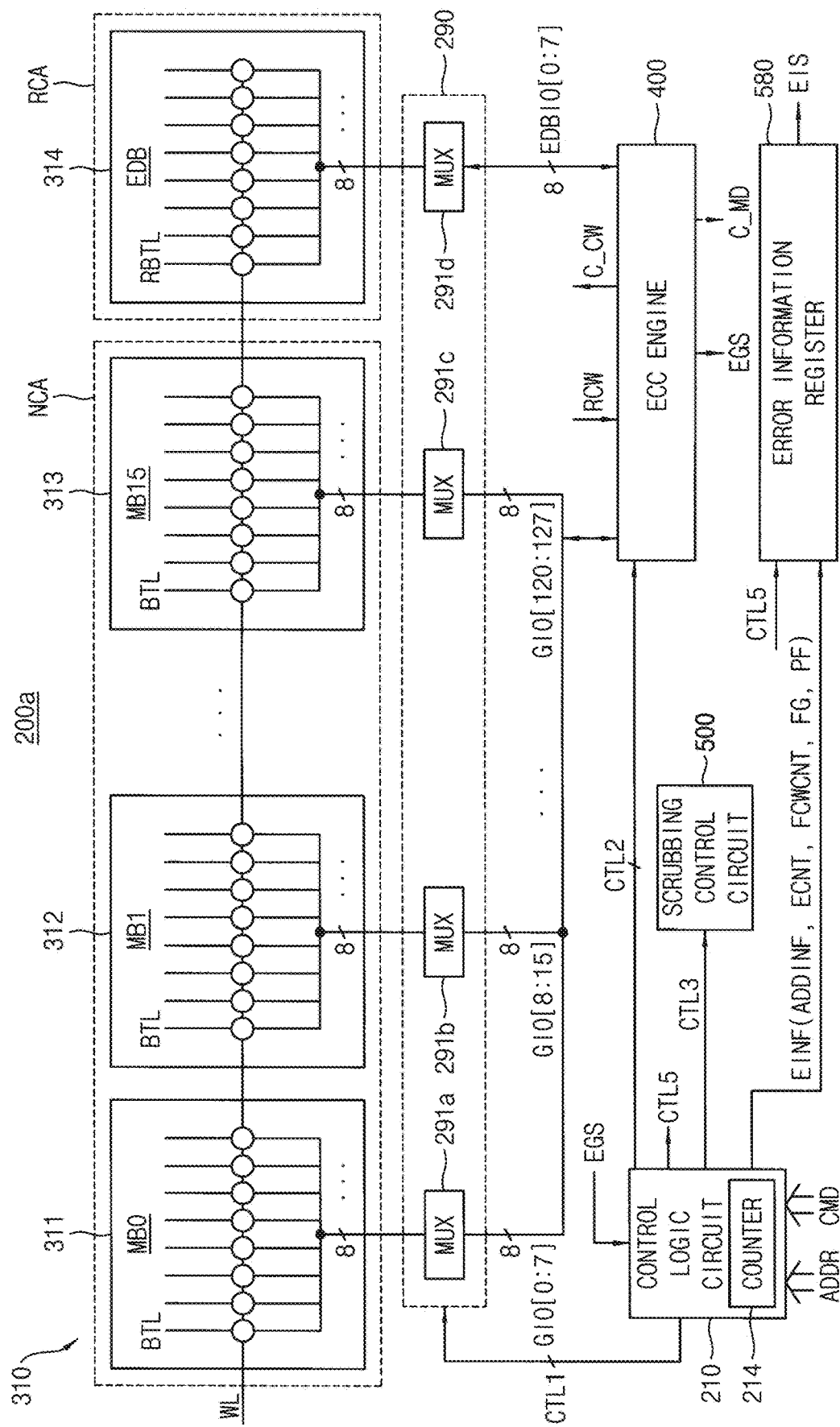
FIG. 14 illustrates the semiconductor memory device of FIG. 2 in a read operation or a refresh operation.

FIG. 14 illustrates the semiconductor memory device of FIG. 2 in a read operation or a refresh operation.

In FIG. 14, the control logic circuit 210, the first bank array 310, the I/O gating circuit 290, the ECC engine 400, the scrubbing control circuit 500 and the error information register 580 are illustrated.

In some example embodiments, at least some elements of the semiconductor memory device 200a may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the semiconductor memory device 200a. In some example embodiments, two or more, or all, elements of the semiconductor memory device 200a may be implemented by a separate or same processing circuitries.

Referring to FIG. 14, when the command CMD is a refresh command (to designate a refresh operation or a read command to designate a read operation, the control logic circuit 210 provides the first control signal CTL1 to the I/O gating circuit 290 such that a first (read) codeword RCW stored in the sub-page of the target page in the first bank array 310 is provided to the ECC engine 400. Although FIG. 14 illustrates an example in which sense amplifiers are not disclosed, the first bank sense amplifiers 285a may be coupled between the first bank array 310 and the I/O gating circuit 290.

In the refresh operation, the ECC engine 400 performs a scrubbing operation by performing a first ECC decoding on the codeword RCW, correcting at least one error bit in the codeword RCW to generate a corrected codeword RCW and writing back the corrected main data in a memory location in which a sub-page is stored. When the least one error bit is detected during performing the scrubbing operation, the ECC engine 400 provides the error generation signal EGS to the control logic circuit 210 whenever the error bit is detected, a counter 214 in the control logic circuit 210 counts the error generation signal EGS and the control logic circuit 210 records the error information EINF in the error information register 580. The error information EINF may at least include a number of error occurrences of selected memory cell rows based on counting the error generation signal EGS. In the normal read operation, the ECC engine 400 performs a second ECC decoding on the codeword RCW of each of second sub-pages in a second memory cell row and provides the error generation signal EGS to the control logic circuit 210 when the ECC engine 400 detects an error bit in the codeword RCW.

Accordingly, it will be understood that the control logic circuit 210 may control the ECC engine 400 to cause the ECC engine 400 to perform a first ECC decoding operation based on reading data corresponding to a first codeword from each of the first sub-pages and based on correcting at least one error bit in the first codeword RCW to generate a corrected first codeword RCW, perform a scrubbing operation based on writing back the corrected first codeword RCW in a memory location of the memory cell array in which each of the first sub-pages are stored, and perform a second ECC decoding operation based on reading data corresponding to a second codeword RCW from each of the second sub-pages, based on correcting at least one error bit in the second codeword RCW to generate a corrected second codeword RCW and based on outputting the corrected second codeword RCW.

The error information EINF may include address information ADDINF, a number of error occurrences ECNT, a ranking information RNK, a number of sub-pages including error bits FCWCNT, flag information FG indicating whether the error information EINF is initially written in the error information register 580 and a permanent fault information PF. The control logic circuit 210 controls the error information register 580 to transmit the error information EINF of a memory cell row or sub-pages having the permanent fault to the memory controller 100 as the error information signal EIS through the fifth control signal CTL5.

Accordingly, the control logic circuit 210 may transfer an address of a first memory cell row to an external memory controller 100 (which is external to the semiconductor memory device 200) as an error information signal EIS in response to a determination that a quantity of error occurrences of the first sub-pages of the first memory cell row is equal to or greater than M (M is a natural number greater than one) subsequent to the ECC engine 400 performing the first ECC decoding on the first memory cell row, and the control logic circuit 210 may transfer an address of the second memory cell row to the external memory controller 100 as the error information signal EIS in response to a determination that a quantity of error occurrences of the second sub-pages of the second memory cell row is equal to or greater than M, subsequent to the ECC engine 400 performing the second ECC decoding on the second memory cell row. The control logic circuit 210 may transfer the error information signal EIS to the external memory controller 100 via one of a dedicated pin or a data input/output (I/O) pin. Accordingly, it will be understood that the control logic circuit 210 may be configured to transmit error information associated with at least one selected memory cell row, for which the control logic circuit controls the ECC engine 400 to skip an ECC encoding operation and an ECC decoding operation thereon.

The control logic circuit 210 may record an address of one of the first sub-pages in the error information register 580 and may record the address of the one of first sub-pages as to have permanent fault in response to a determination that the number (e.g., quantity) of error occurrences of one of the first sub-pages of the first memory cell row is equal to or greater than N (N is a natural number greater than one) concurrently with the ECC engine 400 performing the scrubbing operation on the memory cell rows for a plurality of times (e.g., performs a plurality of iterations of the scrubbing operation).

The control logic circuit 210 may record an address of the first memory cell row in the error information register 580 and may record the address of the first memory cell row as to have a permanent fault in response to a determination that the number (e.g., quantity) of error occurrences of the first sub-pages of the first memory cell row is equal to or greater than M (M is a natural number greater than one) concurrently with the ECC engine 400 performing the scrubbing operation on the first memory cell row once (e.g., performs exactly one iteration of the scrubbing operation).

The control logic circuit 210 may record an address of the second memory cell row in the error information register 580 and may record the address of the second memory cell row as to have a permanent fault in response to a determination that the number (e.g., quantity) of error occurrences of the second sub-pages of the second memory cell row is equal to or greater than M concurrently with the ECC engine 400 performing the normal read operation on the second memory cell row.

The control logic circuit 210 may control the ECC engine 400 to cause the ECC engine 400 to skip the ECC decoding operation and the ECC encoding operation on the memory cell row or the sub-page having the permanent fault right after (e.g., immediately subsequent, without the control logic circuit 210 performing any intervening operations) the control logic circuit 210 records the first and/or second memory cell row, and/or the first and/or second sub-page, in the error information register 580 as to have the permanent fault. Accordingly, it will be understood that the control logic circuit 210 may record error information in the error information register 580 and may control the ECC engine 400 to skip an ECC encoding operation and an ECC decoding operation on at least one selected memory cell row of the first memory cell row and the second memory cell row, based on referring to the error information that is recorded in the error information register 580.

FIG. 15 illustrates the error information register in the semiconductor memory device of FIG. 2 according to some example embodiments.

Referring to FIG. 15, each of indexes (e.g., entries) Idx1, Indx2, . . . , Idxp (p is a natural number greater than two) may include page error information on each of some pages of memory cell array 300. Each entry may correspond to one of the pages. The error information register 580 includes a plurality of columns 581, 582, 583, 584, 585, and 586.

The first column 581 stores ranking information RNK on ranking of a number of error occurrences based on the number of the error occurrences of each of the some pages. An entry with ranking information RNK having a lowest value (e.g., 1) could be considered a highest rank and an entry with ranking information RNK having a highest value could be considered a lowest rank. For example, a first page associated with idx1 having 2 error occurrences during a given period could receive a RNK of 2 while a second page associated with idx2 could receive a higher RNK of 1 when it has 4 error occurrences during the given period.

The second column 582 stores address information ADDINF of each of the some pages. In some example embodiments, the address information ADDINF includes at least one of a bank group address ('BGA'), a bank address ('BA'), and a row address ('RA'). While FIG. 3 illustrated a single group of bank arrays (e.g., 310-340), additional groups of bank arrays may be present. The bank group address may identify one of these groups. For example, if there is a first group of bank arrays includes bank arrays 310-380 and a second group of bank arrays, and the errors are occurring in the first group, the BGA would identify the first group. The bank address may identify one of the banks of the identified group. The row address may identify a page of the one bank.

The third column 583 stores a number of error occurrences ECNT of each of the some pages. For example, the error information register 580 of FIG. 14 illustrates the number of error occurrences ECNT for a page having address A is 2 and the number of error occurrences ECNT for a page having address B is 4.

The fourth column 584 stores a number of sub-pages FCWCNT including a bit error, of each of the some pages. For example, if a second page has 4 bit errors (ECNT=4), the second page has 64 sub-pages, but only 3 of the 64 sub-pages have bit errors (e.g., sub-pages 1 and 12 each have 1 bit error and sub-page 43 has 2 bit errors), the entry of the second page would have a FCWCNT of 3.

The fifth column 585 stores the flag information FG and the sixth column 586 stores the permanent fault information PF of each of the some pages. The flag information FG indicates whether the error information of the corresponding page is initially written into the error information register 580. When the error information of the corresponding page is initially written into the error information register 580, the flag information FG has a first logic level (e.g., 0). In some example embodiments, if the flag information FG of a page has a second logic level (e.g., 1), the page previously had error information. The permanent fault information PF may indicate whether each of the some pages has the permanent fault. If the page or the sub-page has a permanent fault, the permanent fault information PF has a second logic level (e.g., 1). If the page or the sub-page has a transient fault, the permanent fault information PF has a first logic level (e.g., 0).

The memory controller 100 may determine error handling policy of the memory cell row or the sub-page having the permanent fault based on the error information EINF in the error information register 580.

Figure 16:
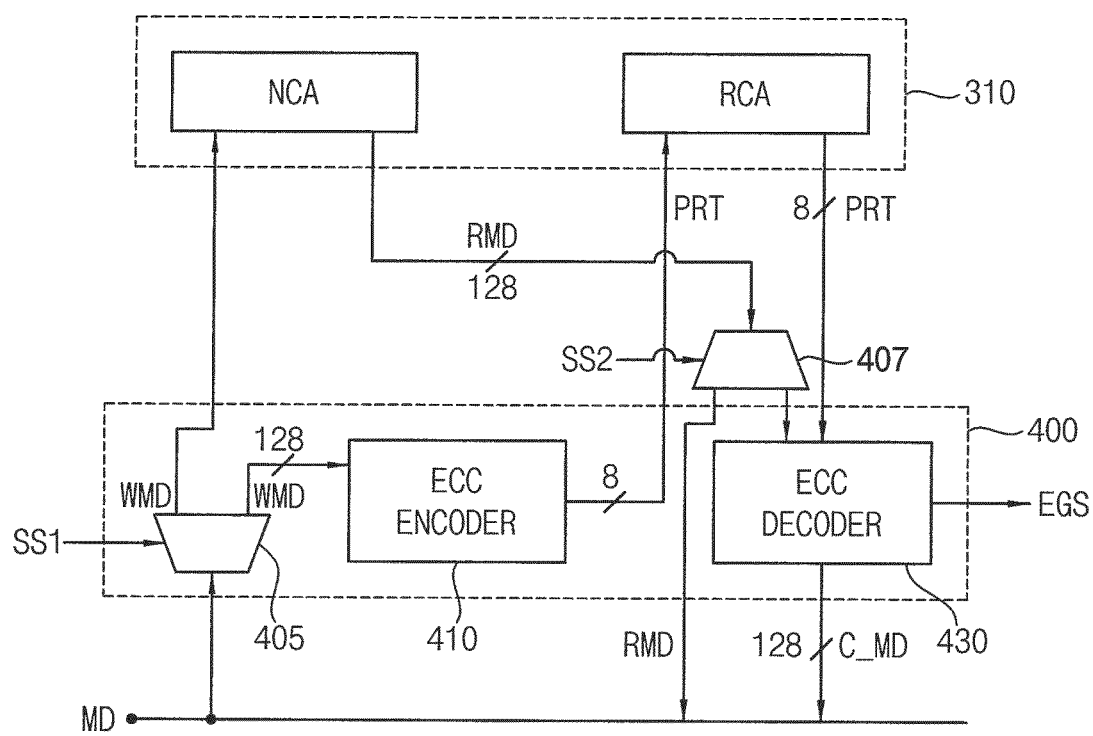
FIG. 16 is a block diagram illustrating an example of the ECC engine in the semiconductor memory device of FIG. 2 according to some example embodiments.

FIG. 16 is a block diagram illustrating an example of the ECC engine in the semiconductor memory device of FIG. 2 according to some example embodiments.

Referring to FIG. 16, the ECC engine 400 includes selection circuits 405 and 407, an ECC encoder 410 and an ECC decoder 430.

In some example embodiments, some or all elements of the ECC engine 400 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the ECC engine 400. In some example embodiments, two or more, or all, elements of the ECC engine 400 may be implemented by a separate or same processing circuitries.

The selection circuit 405 provides the main data MD to one of the normal cell region NCA and the ECC encoder 410 in response to a first selection signal SS1. The ECC encoder 410 may generate parity bits PRT associated with a write data WMD to be stored in the normal cell array NCA of the first bank array 310. The parity bits PRT may be stored in the redundancy cell array RCA of the first bank array 310.

The selection circuit 407 provides a read data RMD read from the first bank array 310 to one of the data I/O buffer 295 and the ECC decoder 430.

The ECC decoder 430 may perform an ECC decoding on the read data RMD based on the read data RMD and the parity bits PRT. When the read data RMD includes at least one error bit as a result of the ECC decoding, the ECC decoder 430 provides the error generation signal EGS to the control logic circuit 210, and corrects the error bit in the read data RMD to output the corrected main data C_MD.

The ECC encoder 410 may perform the ECC encoding using a single error correction (SEC) code and the ECC decoder 430 may perform the ECC decoding using the SEC code. The first selection signal SS1 and the second selection signal SS2 may be included in the second control signal CTL2.

Figure 17:
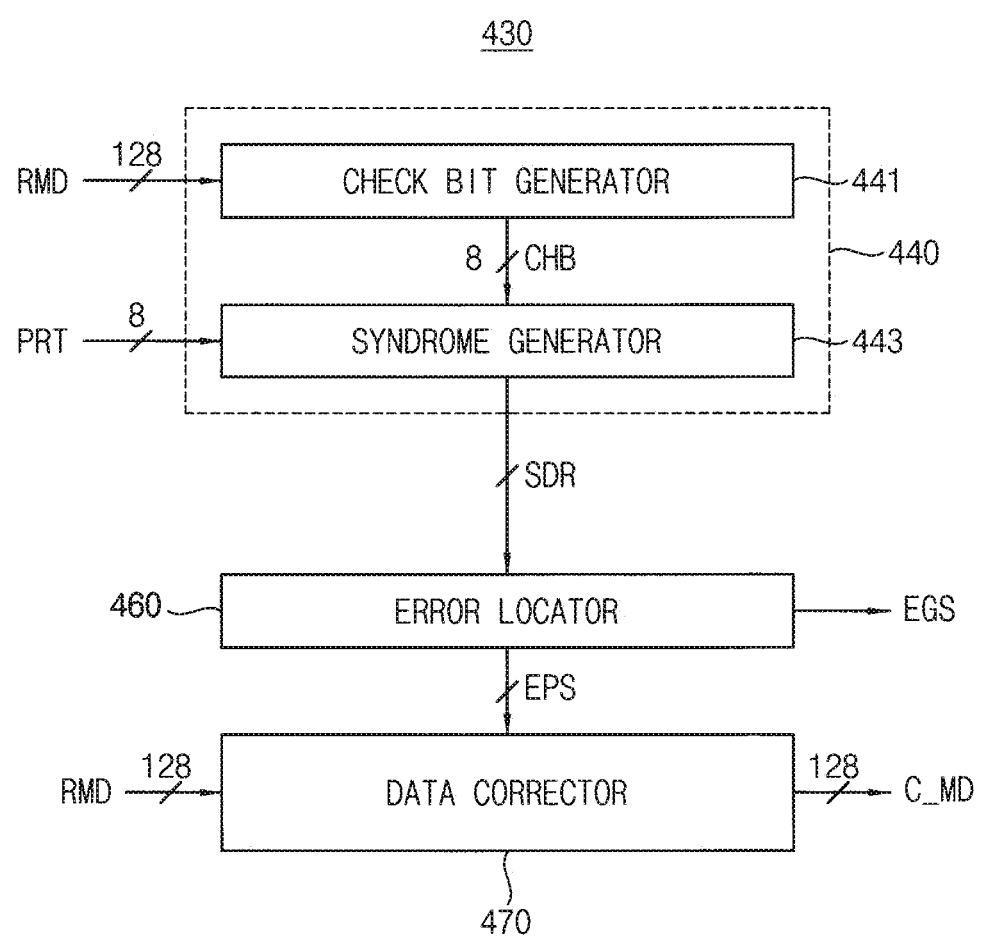
FIG. 17 illustrates an example of the ECC decoder in the ECC engine of FIG. 16 according to some example embodiments.

FIG. 17 illustrates an example of the ECC decoder 430 in the ECC engine of FIG. 16 according to some example embodiments.

Referring to FIG. 17, the ECC decoder 430 may include a syndrome generation circuit 440, an error locator 460 and a data corrector 470. The syndrome generation circuit 440 may include a check bit generator 441 and a syndrome generator 443.

In some example embodiments, some or all elements of the ECC decoder 430 may be included in, may include, and/or may be implemented by, one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device (e.g., a memory), for example a solid state drive (SSD), storing a program of instructions, and a processor configured to execute the program of instructions to implement the functionality of some or all elements of the ECC decoder 430. In some example embodiments, two or more, or all, elements of the ECC decoder 430 may be implemented by a separate or same processing circuitries.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error position signal EPS to the data corrector 470 when all bits of the syndrome SDR are not 'zero'. In addition, when the read data RMD includes the error bit, the error locator 460 provides the error generation signal EGS to the control logic circuit 210.

The data corrector 470 receives the read data RMD, corrects the error bit in the read data RMD based on the error position signal EPS when the read data RMD includes the error bit and outputs the corrected main data C_MD.

Figure 18:
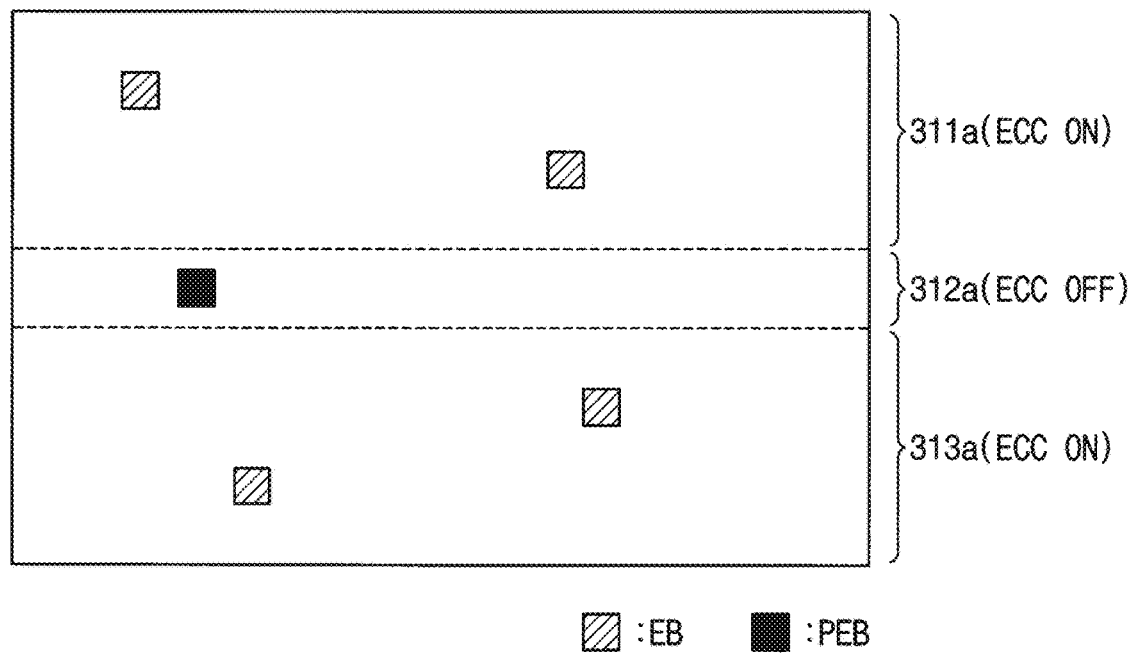
FIG. 18 and FIG. 19 illustrate error distributions in the first bank array in FIG. 14, respectively.
Figure 19:
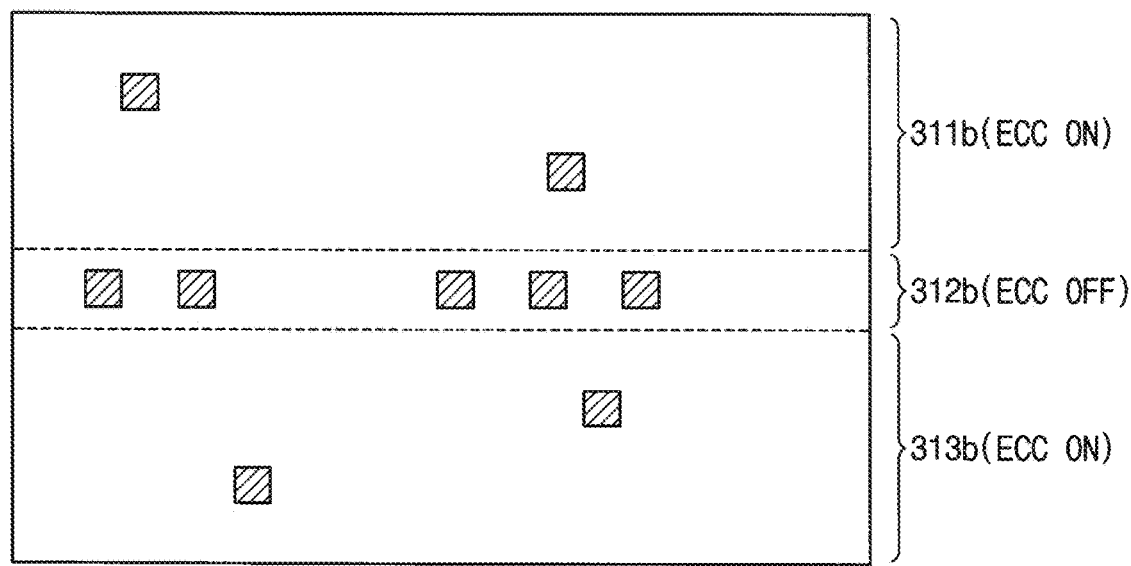

FIGS. 18 and 19 illustrate error distributions in the first bank array in FIG. 14, respectively.

Referring to FIG. 18, each of regions 311a and 313a of a first bank array 310a includes transient error bits EB and a region 312a of the first bank array 310a includes a permanent error bit PEB. Therefore, the control logic circuit 210 controls the ECC engine 400 such that the ECC engine 400 performs an ECC operation on the regions 311a and 313a (ECC ON) and the ECC engine 400 skips an ECC encoding and an ECC decoding on a sub-page in the region 312a (ECC OFF).

Referring to FIG. 18, each of regions 311b and 313b of a first bank array 310b includes transient error bits EB and a region 312b of the first bank array 310a includes transient error bits EB which are equal to or greater than M. Therefore, the control logic circuit 210 controls the ECC engine 400 such that the ECC engine 400 performs an ECC operation on the regions 311b and 313b (ECC ON) and the ECC engine 400 skips an ECC encoding and an ECC decoding on sub-pages in the region 312b (ECC OFF). If the ECC engine 400 does not skip an ECC encoding and an ECC decoding on sub-pages or a memory cell row (a page) having the permanent fault, the memory controller 100 cannot be informed of the permanent fault, a permanent single bit error may propagate as an uncorrectable error.

Figure 20:
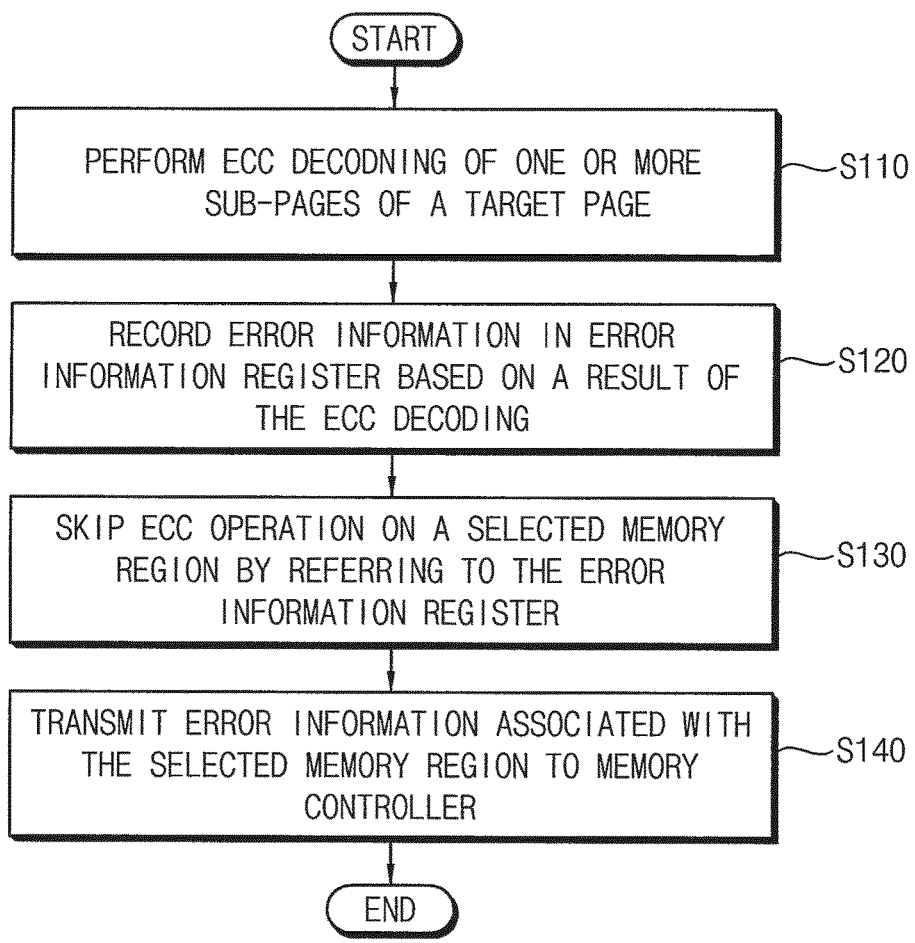
FIG. 20 is a flow chart illustrating a method of operating a semiconductor memory device according to some example embodiments.

FIG. 20 is a flow chart illustrating a method of operating a semiconductor memory device according to some example embodiments.

Referring to FIGS. 2 through 20, there is provided a method of operating a semiconductor memory device 200 which includes a memory cell array 300 having a plurality of memory cell rows. In the method, the ECC engine 400 sequentially performs an ECC decoding of one or more sub-pages of a target page in a read operation or a scrubbing operation (S110). When an error bit is detected as a result of the ECC decoding, the ECC engine 400 provides an error generation signal EGS to the control logic circuit 210 and the control logic circuit 210 records error information EINF in the error information register 580 (S120).

The control logic circuit 210 controls the ECC engine 400 to skip an ECC encoding and an ECC decoding on a sub-page or a memory cell row (selected memory region) having a permanent fault by referring to the error information EINF in the error information register 580 (S130).

The control logic circuit 210 controls the error information register 580 such that error information associated with the selected memory region is transmitted to the memory controller (S140). The memory controller 100 may determine error management policy on the sub-page or the memory cell row having the permanent fault based on the transmitted error information associated with the selected memory region (e.g., selected at least one memory cell row).

FIG. 21 is a block diagram illustrating a semiconductor memory device according to some example embodiments.

Referring to FIG. 21, a semiconductor memory device 600 may include a first group of dies 610 and a second group of dies 620 configured to provide a soft error analyzing and correcting function in a stacked chip structure. Each die, as described herein may refer to a portion (e.g., a block) of semiconducting material on which a given portion (e.g., functional circuit) of the semiconductor memory device 600 is fabricated. In some example embodiments, the semiconductor memory device 600 may include and/or be configured to implement some or all of any example embodiment of the semiconductor memory device 200 as described herein. As described herein, it will be understood that any part of the semiconductor memory device 200 may be implemented, in part or in full, by one or more dies (e.g., any of the dies 610 and/or 620 of the semiconductor memory device 600), which will be understood to include portions and/or blocks of semiconductor material that are fabricated to include one or more instances of integrated circuitry that are configured to implement some or all of one or more, or all, portions of the semiconductor memory device 200 according to any of the example embodiments described herein. For example, separate portions of the semiconductor memory device 200 as described with reference to FIGS. 1 and/or 2 may be implemented by separate dies (e.g., one or more dies 610 and/or one or more 620) based on said separate dies including separate instances of integrated circuitry that configure said separate dies to implement said separate portions of the semiconductor memory device 200 (e.g., the ECC engine 400, the scrubbing control circuit 500, the error information register 580, the control logic circuit 210, the memory cell array 300, any combination thereof, or the like).

The first group of dies 610 may include at least one buffer or logic die 611. The second group of dies 620 may include a plurality of memory dies 620-1 to 620-p which are stacked on the buffer die 611 and are configured to convey data through a plurality of through substrate via lines, for example, through silicon via (TSV) lines, for example the TSV line group 632 and/or the parity TSV line group 634.

At least one of the memory dies 620-1 to 620-p may include a cell core 622 that includes a plurality of memory cells coupled to a plurality of word-lines and a plurality of bit-lines.

The buffer die 611 may include (e.g., may include integrated circuitry that configures the buffer die 611 to implement) an ECC engine 612 which corrects a transmission error using the transmission parity bits when a transmission error is detected from the transmission data received through the TSV liens and generates error-corrected data and an error information register 613 that stores error information. The buffer die 611 may further include integrated circuitry that configures the buffer die 611 to implement one or more other portions of the semiconductor memory device 200, including at least the control logic circuit 210.

The ECC engine 612 may employ (e.g., implement) the ECC engine 400 of FIG. 16 and the error information register 613 may employ the error information register 580 of FIG. 15. Although not illustrated, the buffer die 611 may further include a refresh control circuit 245 and a scrubbing control circuit 500 which are mentioned above.

The semiconductor memory device 600 may be a stack chip type memory device or a stacked memory device which conveys data and control signals through the TSV lines. The TSV lines may be also called 'through electrodes'.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 128-bit data, the transmission parity bits may be set to 8 bits. However, the scope and spirit of the inventive concepts are not limited thereto. The number of transmission parity bits increases or decreases.

With the above description, a data TSV line group 632 which is formed at one memory die 620-p may include 128 TSV lines L1 to Lp, and a parity TSV line group 634 may include 8 TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 611 may be connected with the memory controller 100 through the data bus B10.

FIG. 22 is a cross-sectional view of a 3D chip structure employing the semiconductor memory device 600 of FIG. 21 according to some example embodiments.

FIG. 22 shows a 3D chip structure 700 in which a host and an HBM are directly connected without an interposer layer.

Referring to FIG. 22, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure 620 as the memory dies in FIG. 21.

In FIG. 22, the buffer die 611 or a logic die of FIG. 21 is omitted. However, the buffer die 611 or the logic die may be disposed between the memory die D11 and the host die 710. To implement the HBM (620) structure, TSV lines may be formed at the memory dies D11 and D14. The TSV lines may be electrically connected with micro bumps MCB placed between memory dies.

Figure 23:
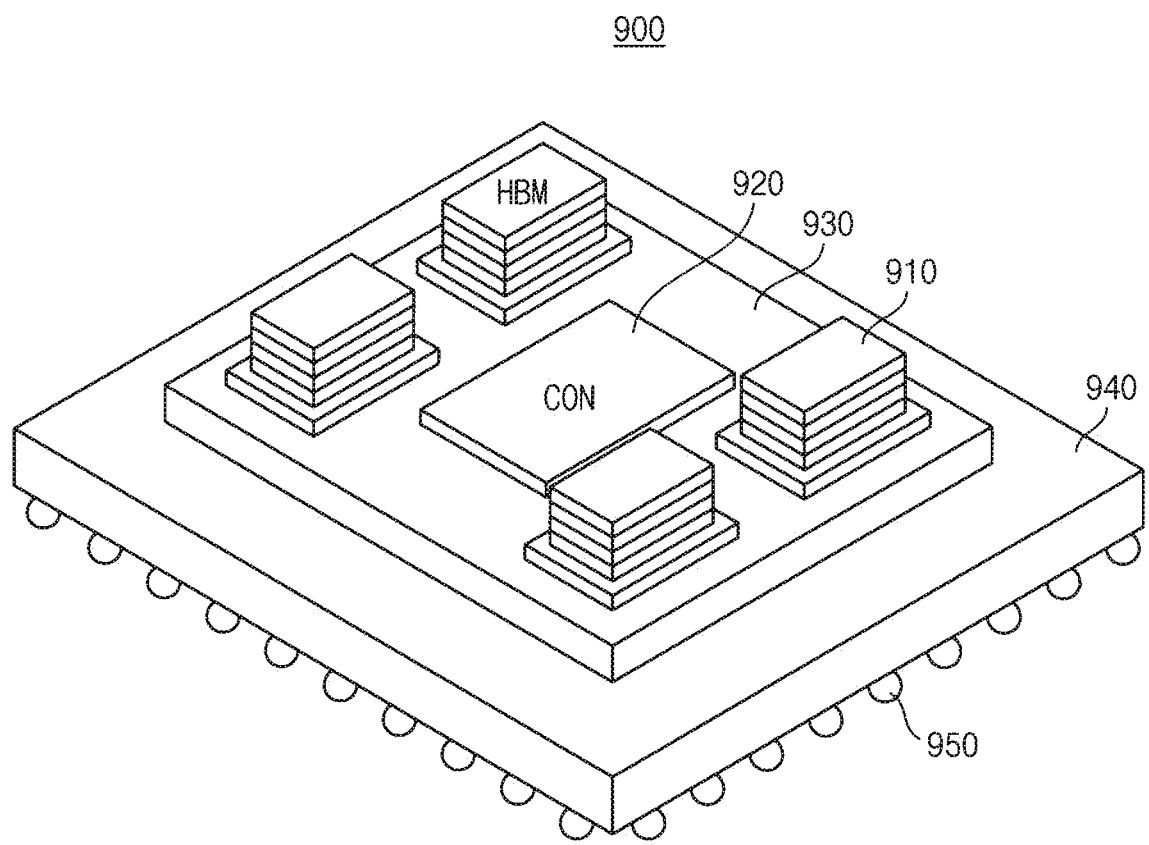
FIG. 23 is a diagram illustrating a semiconductor package including the stacked memory device according to some example embodiments.

FIG. 23 is a diagram illustrating a semiconductor package including the stacked memory device according to some example embodiments.

Referring to FIG. 23, a semiconductor package 900 may include one or more stacked memory devices 910 and a memory controller 920.

The stacked memory devices 910 and the memory controller 920 may be mounted on an interposer 930, and the interposer on which the stacked memory devices 910 and the memory controller 920 are mounted may be mounted on a package substrate 940. The memory controller 920 may employ (e.g., implement) the memory controller 100 in FIG. 1.

In some example embodiments, one or more stacked memory devices 910 may include and/or be configured to implement some or all of any example embodiment of the semiconductor memory device 200 as described herein. Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. The buffer die may include an ECC engine and an error information register and each of the memory dies may include a memory cell array. Therefore, each of the stacked memory devices 910 may control the ECC engine to skip an ECC encoding and an ECC decoding on selected memory cell row or some sub-pages based on a number of error occurrences and may provide the memory controller 920 with information associated with permanent fault (error).

The plurality of stacked memory devices 910 may be mounted on the interposer 930, and the memory controller 920 may communicate with the plurality of stacked memory devices 910.

For example, each of the stacked memory devices 910 and the memory controller 920 may include a physical region, and communication may be performed between the stacked memory devices 910 and the memory controller 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

Aspects of the present inventive concepts may be applied to systems using semiconductor memory devices that employ dynamic memory cells and an ECC engine.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A semiconductor memory device, comprising:
   a memory cell array including a plurality of memory cell rows, each of the plurality of memory cell rows including a plurality of dynamic memory cells;
   an error correction code (ECC) engine circuit;
   an error information register; and
   a control logic circuit configured to control the ECC engine circuit,
   wherein the control logic circuit is configured to control the ECC engine circuit to cause the ECC engine circuit to generate an error generation signal based on performing a first ECC decoding on first sub-pages in at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row,
   wherein the control logic circuit is further configured to record error information in the error information register and is configured to control the ECC engine circuit to cause the ECC engine circuit to skip an ECC encoding operation and an ECC decoding operation on at least one selected memory cell row of the at least one first memory cell row and the at least one second memory cell row based on referring to the error information, and
   wherein the error information at least indicates a quantity of error occurrences in the first memory cell row and the second memory cell row.

2. The semiconductor memory device of claim 1, wherein the control logic circuit is configured to control the ECC engine circuit to cause the ECC engine circuit to
   perform a first ECC decoding operation based on reading data corresponding to a first codeword from each of the first sub-pages and based on correcting at least one error bit in the first codeword to generate a corrected first codeword,
   perform the scrubbing operation based on writing back the corrected first codeword in a memory location of the memory cell array in which each of the first sub-pages are stored, and
   perform a second ECC decoding operation based on reading data corresponding to a second codeword from each of the second sub-pages, based on correcting at least one error bit in the second codeword to generate a corrected second codeword and based on outputting the corrected second codeword.

3. The semiconductor memory device of claim 1, wherein the control logic circuit is configured to record an address of one of the first sub-pages in the error information register, and to record the address of the one of the first sub-pages as to have a permanent fault in response to a determination that a quantity of error occurrences of the one of the first sub-pages of the first memory cell row is equal to or greater than N, where N is a natural number greater than one, concurrently with the ECC engine circuit performing the scrubbing operation on the plurality of memory cell rows for a plurality of times.

4. The semiconductor memory device of claim 3, wherein the control logic circuit is configured to control the ECC engine circuit to cause the ECC engine circuit to skip the ECC decoding operation and the ECC encoding operation on the one of the first sub-pages immediately subsequent to the control logic circuit recording the first sub-page in the error information register as to have the permanent fault.

5. The semiconductor memory device of claim 1, wherein the control logic circuit is configured to record an address of the first memory cell row in the error information register and to record the address of the first memory cell row as to have a permanent fault in response to a determination that a quantity of error occurrences of the first sub-pages of the first memory cell row is equal to or greater than M, where M is a natural number greater than one, concurrently with the ECC engine circuit performing the scrubbing operation on the first memory cell row once.

6. The semiconductor memory device of claim 5, wherein the control logic circuit is configured to control the ECC engine circuit to cause the ECC engine circuit to skip the ECC decoding operation and the ECC encoding operation on the first sub-pages of the first memory cell row immediately subsequent to the control logic circuit recording the first memory cell row in the error information register as to have the permanent fault.

7. The semiconductor memory device of claim 1, wherein the control logic circuit is configured to record an address of the second memory cell row in the error information register and to record the address of the second memory cell row as to have a permanent fault in response to a determination that a quantity of error occurrences of the second sub-pages of the second memory cell row is equal to or greater than M, where M is a natural number greater than one, concurrently with the ECC engine circuit performing the normal read operation on the second memory cell row.

8. The semiconductor memory device of claim 7, wherein the control logic circuit is configured to control the ECC engine circuit to cause the ECC engine circuit to skip the ECC decoding operation and the ECC encoding operation on the second sub-pages of the first memory cell row immediately subsequent to the control logic circuit recording the second memory cell row in the error information register as to have the permanent fault.

9. The semiconductor memory device of claim 1, wherein
   the control logic circuit is configured to transfer an address of the first memory cell row to an external memory controller as an error information signal in response to a determination that a quantity of error occurrences of the first sub-pages of the first memory cell row is equal to or greater than M, where M is a natural number greater than one, subsequent to the ECC engine circuit performing the first ECC decoding on the first memory cell row; and
   the control logic circuit is configured to transfer an address of the second memory cell row to the external memory controller as the error information signal in response to a determination that a quantity of error occurrences of the second sub-pages of the second memory cell row is equal to or greater than M, subsequent to the ECC engine circuit performing the second ECC decoding on the second memory cell row.

10. The semiconductor memory device of claim 9, wherein the control logic circuit is configured to transfer the error information signal to the external memory controller via one of a dedicated pin or a data input/output pin.

11. The semiconductor memory device of claim 1, further comprising:
a scrubbing control circuit configured to generate a scrubbing address that designates at least the at least one first memory cell row on which the scrubbing operation is to be performed, such that the scrubbing operation is performed on the at least one first memory cell row based on the scrubbing address designating the at least one first memory cell row; and
a refresh control circuit configured to generate refresh row addresses to cause one or more memory cell rows of the plurality of memory cell rows to be refreshed in response to a command received from an external memory controller,
wherein the scrubbing control circuit is configured to count the refresh row addresses and generate the scrubbing address in response to the scrubbing control circuit counting K refresh row addresses of the refresh row addresses, K being a natural number greater than one.

12. The semiconductor memory device of claim 11, wherein the scrubbing control circuit is configured to sequentially generate the scrubbing address designating L codewords included in the first memory cell row, L being a natural number equal to or greater than 1 and smaller than K.

13. The semiconductor memory device of claim 11, wherein the scrubbing control circuit includes:
a counter configured to count the refresh row addresses to generate an internal scrubbing signal, wherein the counter is configured to activate the internal scrubbing signal in response to the counter counting the K refresh row addresses of the refresh row addresses;
a scrubbing address generator configured to generate a normal scrubbing address associated with a normal scrubbing operation for the at least one selected memory cell row in a first scrubbing mode, in response to the internal scrubbing signal and a scrubbing mode signal; and
a weak codeword address generator configured to generate a weak codeword address associated with a weak scrubbing operation associated with weak codewords in the at least one selected memory cell row in a second scrubbing mode, in response to the internal scrubbing signal and the scrubbing mode signal.

14. The semiconductor memory device of claim 13, wherein the weak codeword address generator includes:
an address storing table configured to store address information that indicates corresponding addresses of the weak codewords; and
a table pointer configured to generate a pointer signal that provides location information associated with the address storing table in response to the internal scrubbing signal.

15. The semiconductor memory device of claim 1, further comprising:
a victim address detector configured to count a quantity of accesses to a first memory region in the memory cell array to generate at least one victim address designating at least one adjacent memory region adjacent to the first memory region in response to a determination that the quantity of the counted accesses reaches a threshold value during a reference interval.

16. The semiconductor memory device of claim 15, wherein
the victim address detector is configured to provide the at least one victim address to a scrubbing control circuit; and
the scrubbing control circuit is configured to store the at least one victim address in an address storing table therein as at least one weak codeword address.

17. The semiconductor memory device of claim 1, further comprising:
a first group of dies including at least one buffer die; and
a second group of dies including a plurality of memory dies, the plurality of memory dies stacked on the at least one buffer die and configured to convey data through a plurality of through silicon via (TSV) lines,
wherein at least one memory die of the plurality of memory dies includes the memory cell array and the ECC engine circuit.

18. A semiconductor memory device, comprising:
a memory cell array including a plurality of memory cell rows, each of the plurality of memory cell rows including a plurality of dynamic memory cells;
an error correction code (ECC) engine circuit;
a refresh control circuit configured to generate refresh row addresses indicating one or more memory cell rows of the plurality of memory cell rows to be refreshed,
a scrubbing control circuit configured to count the refresh row addresses and generate a scrubbing address that designates at least one first memory cell row of the plurality of memory cell rows,
an error information register, and
a control logic circuit configured to control the ECC engine circuit and the scrubbing control circuit,
wherein the control logic circuit is configured to control the ECC engine circuit to cause the ECC engine circuit to generate an error generation signal based on performing a first ECC decoding on first sub-pages in the at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row,
wherein the control logic circuit is further configured to record error information in the error information register and is configured to control the ECC engine circuit to cause the ECC engine circuit to skip an ECC encoding operation and an ECC decoding operation on at least one selected memory cell row of the at least one first memory cell row and the at least one second memory cell row based on referring to the error information, and
wherein the error information at least indicates a quantity of error occurrences in the first memory cell row and the second memory cell row.

19. A memory system, comprising:
a semiconductor memory device; and
a memory controller configured to control the semiconductor memory device, wherein the semiconductor memory device includes
  a memory cell array including a plurality of memory cell rows, each of the plurality of memory cell rows including a plurality of dynamic memory cells;
  an error correction code (ECC) engine circuit;
  an error information register; and
  a control logic circuit configured to control the ECC engine circuit,
    wherein the control logic circuit is configured to control the ECC engine circuit to cause the ECC engine circuit to generate an error generation signal based on performing a first ECC decoding on first sub-pages in at least one first memory cell row of the plurality of memory cell rows in a scrubbing operation on the at least one first memory cell row and based on performing a second ECC decoding on second sub-pages in at least one second memory cell row of the plurality of memory cell rows in a normal read operation on the at least one second memory cell row,
    wherein the control logic circuit is further configured to record error information in the error information register and is configured to control the ECC engine circuit to cause the ECC engine circuit to skip an ECC encoding operation and an ECC decoding operation on at least one selected memory cell row of the at least one first memory cell row and the at least one second memory cell row based on referring to the error information,
    wherein the error information at least indicates a quantity of error occurrences in the first memory cell row and the second memory cell row,
    wherein the control logic circuit is configured to transmit error information associated with the at least one selected memory cell row as an error information signal to the memory controller.

20. The memory system of claim 19, wherein the memory controller is configured to determine an error management policy associated with the at least one selected memory cell row based on the transmitted error information associated with the at least one selected memory cell row.

\* \* \* \* \*